United States Patent
Kwon et al.

(10) Patent No.: US 12,439,745 B2
(45) Date of Patent: Oct. 7, 2025

(54) DISPLAY PANEL AND ELECTRONIC DEVICE INCLUDING THE SAME

(71) Applicant: Samsung Electronics Co., Ltd., Suwon-si (KR)

(72) Inventors: Soo Kyung Kwon, Suwon-si (KR); Yongwook Kim, Suwon-si (KR); Eun Joo Jang, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 527 days.

(21) Appl. No.: 18/051,077

(22) Filed: Oct. 31, 2022

(65) Prior Publication Data

US 2023/0138027 A1    May 4, 2023

(30) Foreign Application Priority Data

Nov. 1, 2021    (KR) ........................ 10-2021-0148259

(51) Int. Cl.
*H01L 33/50* (2010.01)
*C08K 3/16* (2006.01)
(Continued)

(52) U.S. Cl.
CPC ........... *H10H 20/8515* (2025.01); *C08K 3/16* (2013.01); *C08K 5/56* (2013.01); *C08K 9/02* (2013.01);
(Continued)

(58) Field of Classification Search
CPC .. H10H 20/8515; H10H 20/8512; C08K 3/16; C08K 5/56; C08K 9/02;
(Continued)

(56) References Cited

U.S. PATENT DOCUMENTS 9,082,982 B2    7/2015 Jun et al.
10,627,672 B2    4/2020 Jang et al.
(Continued)

FOREIGN PATENT DOCUMENTS

KR    101092639 B1    12/2011
KR    101583980 B1    1/2016
(Continued)

*Primary Examiner* — Tracie Y Green
(74) *Attorney, Agent, or Firm* — CANTOR COLBURN LLP

(57) ABSTRACT

A display panel, including a light emitting panel including at least first and second light emitting units; and a color conversion panel including a surface opposite a surface of the light emitting panel and a color conversion layer including a first and second color conversion region and a partition wall defining the first and second color conversion region, wherein the first and second light emitting units are configured to provide the first color conversion region and the second color conversion region, respectively, with high energy incident light, wherein the first color conversion region includes a first semiconductor nanoparticle-polymer composite including a first polymer matrix including a polymer including a unit having a carboxyl group or an anion form of a carboxyl group, and further including, dispersed in the polymer matrix, first semiconductor nanoparticles an additional metal substance including a group IIB metal, a group IIIA metal, or a combination thereof.

20 Claims, 12 Drawing Sheets

(51) Int. Cl.
- *C08K 5/56* (2006.01)
- *C08K 9/02* (2006.01)
- *C09K 11/02* (2006.01)
- *C09K 11/08* (2006.01)
- *C09K 11/88* (2006.01)
- *H01L 25/075* (2006.01)
- *H10H 20/851* (2025.01)
- *B82Y 20/00* (2011.01)
- *B82Y 40/00* (2011.01)
- *H10H 20/01* (2025.01)

(52) U.S. Cl.
CPC .......... *C09K 11/02* (2013.01); *C09K 11/0883* (2013.01); *C09K 11/883* (2013.01); *H01L 25/0753* (2013.01); *H10H 20/8512* (2025.01); *B82Y 20/00* (2013.01); *B82Y 40/00* (2013.01); *C08K 2003/164* (2013.01); *C08K 2201/011* (2013.01); *H10H 20/0361* (2025.01)

(58) Field of Classification Search
CPC ... C09K 11/02; C09K 11/0883; C09K 11/883; H01L 25/0753
See application file for complete search history.

(56) References Cited

U.S. PATENT DOCUMENTS

| | | |
|---|---|---|
| 2012/0001217 A1 | 1/2012 | Kang et al. |
| 2015/0054425 A1* | 2/2015 | Guschl ............... C08K 9/06 524/588 |
| 2016/0290600 A1* | 10/2016 | Biederman ............ H10H 29/10 |
| 2017/0226346 A1 | 8/2017 | Brown et al. |
| 2018/0040786 A1* | 2/2018 | Chen .................... H10H 20/854 |
| 2019/0018287 A1* | 1/2019 | Lüchinger ............ C09K 11/665 |
| 2019/0081219 A1* | 3/2019 | Chen ................... H10H 20/8513 |
| 2020/0176644 A1* | 6/2020 | Nagasaki ................. F21V 9/08 |
| 2020/0308480 A1 | 10/2020 | Lieberman |
| 2021/0050488 A1* | 2/2021 | Nakabayashi ....... H10H 20/857 |
| 2021/0380875 A1* | 12/2021 | Zhou .................... C09K 11/883 |
| 2023/0217775 A1* | 7/2023 | Kim ...................... H10K 59/351 257/91 |
| 2024/0282892 A1* | 8/2024 | Yoo ................... H10H 20/8515 |

FOREIGN PATENT DOCUMENTS

| | | | |
|---|---|---|---|
| KR | 20170035340 A | 3/2017 | |
| KR | 20170042321 A | 4/2017 | |
| KR | 101823546 B1 | 1/2018 | |
| KR | 20200096952 A | 8/2020 | |
| WO | WO-2020251201 A1 * | 12/2020 | ............... G02B 5/20 |

* cited by examiner

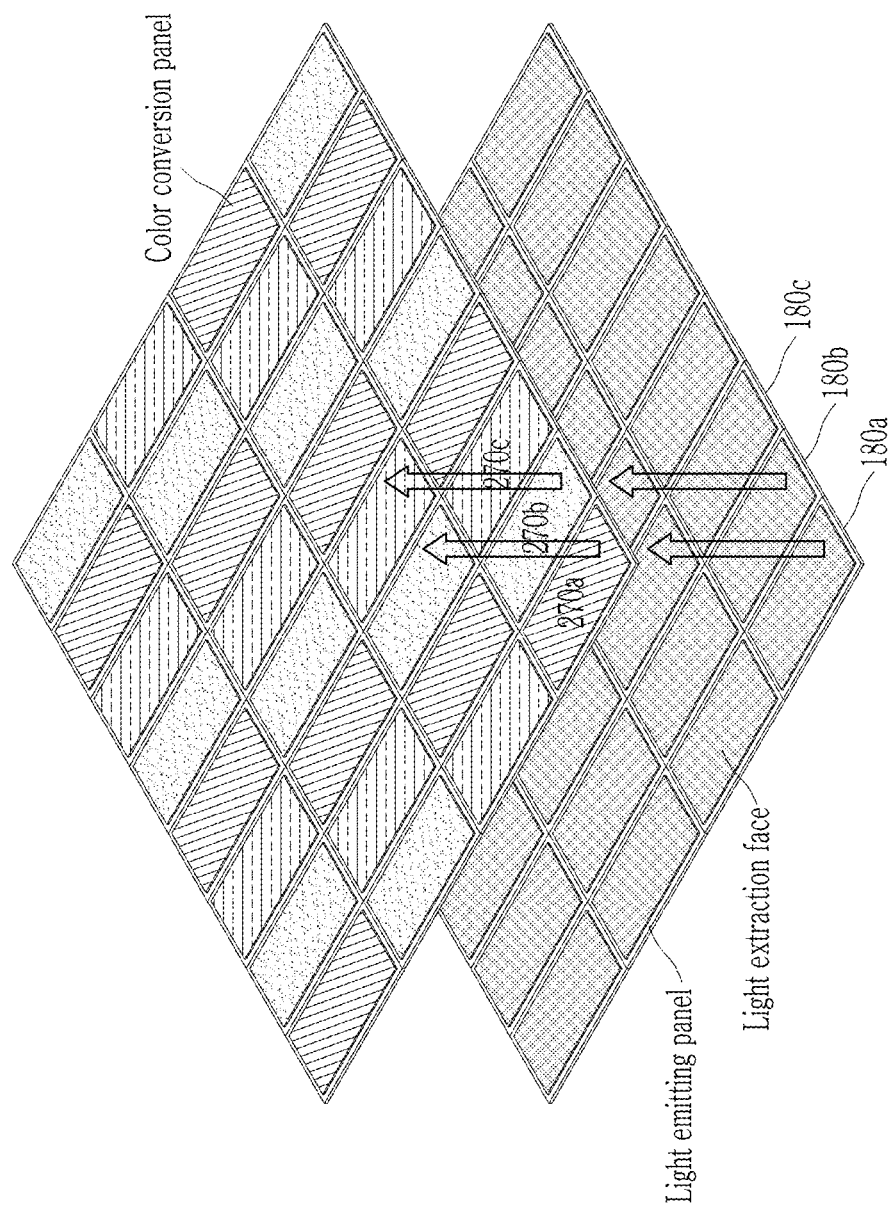

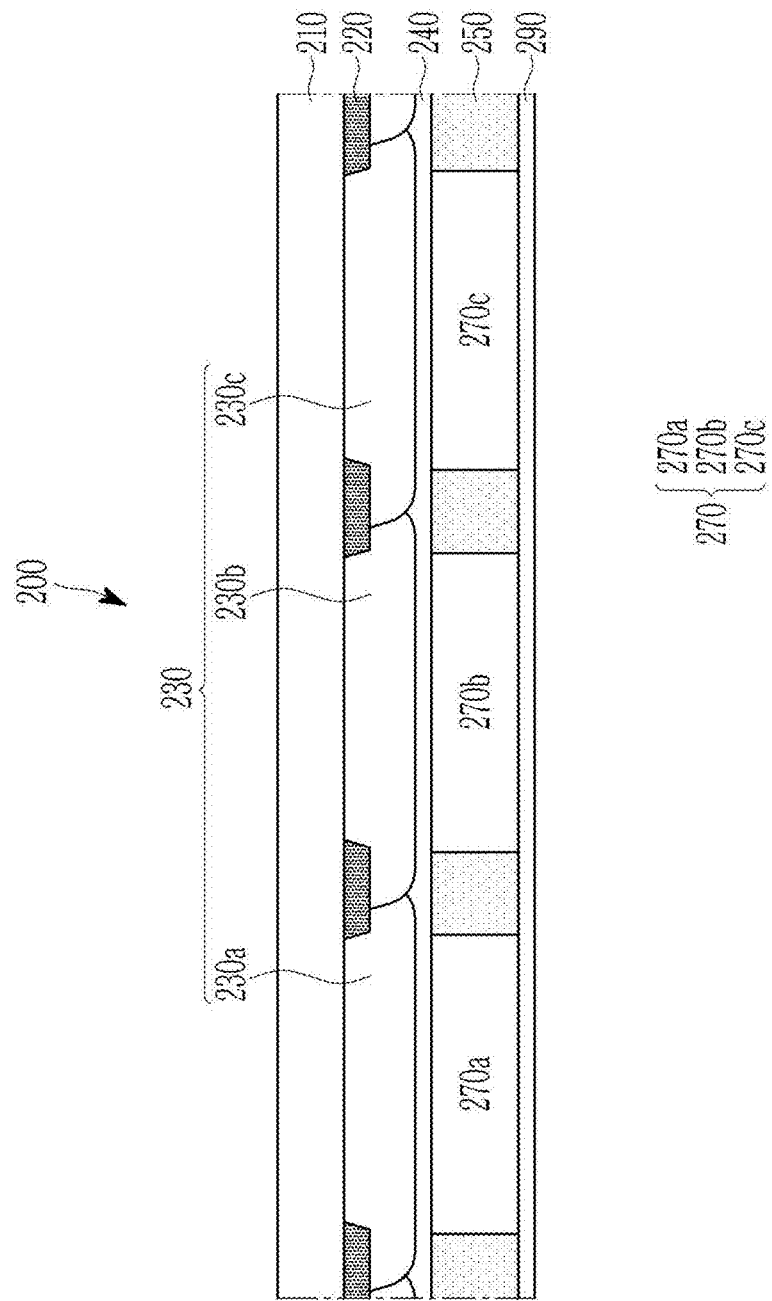

DISPLAY PANEL AND ELECTRONIC DEVICE INCLUDING THE SAME

CROSS-REFERENCE TO RELATED APPLICATION

This application claims priority to Korean Patent Application No. 10-2021-0148259, which was filed in the Korean Intellectual Property Office on Nov. 1, 2021, and all the benefits accruing therefrom under 35 U.S.C. § 119, the content of which in its entirety is herein incorporated by reference.

BACKGROUND

1. Field

A display panel and an electronic device including the display panel are disclosed.

2. Description of the Related Art

A display panel may be included in a wide variety of electronic devices. Nanostructures or semiconductor nanoparticles (e.g., quantum dots) may find applicability, e.g., be used, in a display panel as a light emitting material and an electronic device including the display panels, and may contribute to improved display quality of the panel.

SUMMARY

An embodiment provides a display panel.

An embodiment is related to a production method of the display panel.

An embodiment provides an electronic device (a display apparatus) including the display panel.

An embodiment provides a composition for a color conversion panel that may be included in the display panel of an embodiment.

In an embodiment, a display panel includes a light emitting panel including a plurality of light emitting units; and a color conversion panel including a surface opposite a surface of the light emitting panel (e.g., facing the light emitting panel), wherein the plurality of light emitting units includes a first light emitting unit and a second light emitting unit.

In an embodiment, the color conversion panel includes a color conversion layer including a first color conversion region and a second color conversion region and a partition wall defining the first color conversion region and the second color conversion region.

The first light emitting unit and the second light emitting unit are configured to provide the first color conversion region and the second color conversion region, respectively, with an incident light of an intensity of greater than or equal to about 10,000 candelas per square meter (candelas/m$^2$) (hereinafter, nit), greater than or equal to about 20,000 nit, greater than or equal to about 30,000 nit, or greater than or equal to about 50,000 nit and less than or equal to about 17,000,000 nit, less than or equal to about 16,000,000 nit, less than or equal to about 15,000,000, 10,000,000, 9,000,000 nit, less than or equal to about 1,000,000 nit, or less than or equal to about 10) 450,000 nit.

In an embodiment, the first color conversion region includes a first semiconductor nanoparticle-polymer composite including a first polymer matrix and first semiconductor nanoparticles dispersed in the first polymer matrix, and the first semiconductor nanoparticle-polymer composite (or the first color conversion region) is configured to change (e.g., converts) the incident light to a first light.

In an embodiment, the second color conversion region includes a second semiconductor nanoparticle-polymer composite including a second polymer matrix and second semiconductor nanoparticles dispersed in the second polymer matrix, and the second semiconductor nanoparticle-polymer composite (or the second color conversion region) is configured to change (e.g., converts) the incident light to a second light.

The second light has a maximum luminescent peak wavelength different from the first light.

The first color conversion region and the second color conversion region each independently have a light incident area of greater than or equal to about 1 square micrometer (um$^2$), greater than or equal to about 10 square micrometer ($\mu$m$^2$), greater than or equal to about 50 $\mu$m$^2$, greater than or equal to about 100 $\mu$m$^2$, greater than or equal to about 190 $\mu$m$^2$, greater than or equal to about 250 $\mu$m$^2$, or greater than or equal to about 300 $\mu$m$^2$, and less than or equal to about 1,000 $\mu$m$^2$, less than or equal to about 800 $\mu$m$^2$, less than or equal to about 700 $\mu$m$^2$, or less than or equal to about 650 $\mu$m$^2$.

In an embodiment, the first polymer matrix includes a polymer (e.g., a copolymer) including a unit (e.g., a repeating unit) having a carboxyl group or an anion form of a carboxyl group (e.g., a carboxylate group) (hereinafter collectively "a COO$^-$ moiety"), wherein the first semiconductor nanoparticle-polymer composite further includes an additional metal substance distributed in the first polymer matrix, and the additional metal substance includes a Group IIB metal, a Group IIIA metal, or a combination thereof.

In an embodiment, the second polymer matrix may include a polymer (e.g., a copolymer) including a unit (e.g., repeating unit) including a COO$^-$ moiety. in an embodiment, the second semiconductor nanoparticle-polymer composite may further include an additional metal substance distributed in the second polymer matrix, and the additional metal substance may include a Group IIB metal, a Group IIIA metal, or a combination thereof.

In an embodiment, a wavelength of the incident light may be greater than or equal to about 420 nanometers (nm) and less than or equal to about 490 nm.

In an embodiment, the first light emitting unit and the second light emitting unit may be spaced apart from one another.

In an embodiment, a partition wall may be disposed between the first light emitting unit and the second light emitting unit.

In an embodiment, the first light emitting unit and the second light emitting unit may be spaced apart from one another.

In an embodiment, a partition wall may be optionally disposed between the first light emitting unit and the second light emitting unit.

The light emitting unit may include a microsized light emitting diode, an inorganic nanosized light emitting diode, or a combination thereof.

In an embodiment, a width of the first color conversion region and a width of the second color conversion region may be, each independently, greater than or equal to about 1 micrometer ($\mu$m), greater than or equal to about 3 $\mu$m, greater than or equal to about 5 $\mu$m, greater than or equal to about 7 $\mu$m, or greater than or equal to about 10 $\mu$m.

In an embodiment, a width of the first color conversion region and a width of the second color conversion region may be, each independently, less than or equal to about 600 μm, less than or equal to about 500 μm, less than or equal to about 400 μm, less than or equal to about 300 μm, less than or equal to about 200 μm, less than or equal to about 100 μm, or less than or equal to about 50 μm.

In an embodiment, a luminescent peak wavelength of the first light may be in a range of greater than or equal to about 500 nm, greater than or equal to about 520 nm, and less than or equal to about 580 nm, or less than or equal to about 560 nm.

In an embodiment, a luminescent peak wavelength of the second light may be in a range of greater than about 580 nm and less than or equal to about 680 nm.

In an embodiment, a luminescent peak wavelength of the second light may be in a range of greater than or equal to about 500 nm, greater than or equal to about 520 nm, and less than or equal to about 580 nm, or less than or equal to about 560 nm.

In an embodiment, a luminescent peak wavelength of the first light may be in a range of greater than about 580 nm and less than or equal to about 680 nm.

The first semiconductor nanoparticles, the second semiconductor nanoparticles, or a combination thereof may include a Group II-VI compound, a Group III-V compound, a Group IV-VI compound, a Group IV element or compound, a Group I-III-VI compound, a Group I-II-IV-VI compound, or a combination thereof.

In an embodiment, an amount of the first semiconductor nanoparticles in the first semiconductor nanoparticle-polymer composite may be greater than or equal to about 10 weight percent (wt %), or greater than or equal to about 20 weight percent (wt %), and less than or equal to about 50 wt %, or less than or equal to about 40 wt %, based on a total weight of the first semiconductor nanoparticle-polymer composite.

In an embodiment, an amount of the second semiconductor nanoparticles in the second semiconductor nanoparticle-polymer composite may be greater than or equal to about 10 wt %, or greater than or equal to about 20 wt %, and less than or equal to about 50 wt %, or less than or equal to about 40 wt %, based on a total weight of the second semiconductor nanoparticle-polymer composite.

In an embodiment, the first semiconductor nanoparticle-polymer composite or the first color conversion region may further include metal oxide particles (e.g., dispersed in the first polymer matrix).

In an embodiment, the second semiconductor nanoparticle-polymer composite or the second color conversion region may further include metal oxide particles (e.g., dispersed in the second polymer matrix).

In the first semiconductor nanoparticle-polymer composite or the first color conversion region, an amount of the metal oxide particles may be greater than or equal to about 0.1 wt %, or greater than or equal to about 1 wt %, or greater than or equal to about 4 wt % and less than or equal to about 20 wt %, or less than or equal to about 10 wt %, based on a total weight of the first composite or the first region.

In the second semiconductor nanoparticle-polymer composite or the second color conversion region, an amount of the metal oxide particles may be greater than or equal to about 0.1 wt %, or greater than or equal to about 1 wt %, or greater than or equal to about 4 wt % and less than or equal to about 20 wt %, or less than or equal to about 10 wt %, based on a total weight of the second composite or the second region.

The additional metal substance may include aluminum, gallium, indium, zinc, or a combination thereof.

The additional metal substance may include an aluminum halide, a zinc halide, a hydrocarbyl (e.g., an alkylated) aluminum, a hydrocarbyl (an alkylated) zinc, or a combination thereof.

The additional metal substance may be a metal ion (e.g., an aluminum ion, a zinc ion, or a combination thereof). The additional metal substance may be in a form of a compound.

In the first semiconductor nanoparticle-polymer composite or the second semiconductor nanoparticle-polymer composite, an amount of the additional metal substance may be greater than or equal to about 0.01 wt %, greater than or equal to about 0.05 wt %, or greater than or equal to about 0.1 wt % and less than or equal to about 30 wt %, less than or equal to about 20 wt %, or less than or equal to about 10 wt %, based on a total weight of the first semiconductor nanoparticles or the second semiconductor nanoparticles.

In an embodiment, the first polymer, the second polymer, or a combination thereof may include a polyalkylene-poly (meth)acryl copolymer, a copolymer derived therefrom, or a combination thereof.

In an embodiment, the first polymer matrix, the second polymer matrix, or a combination thereof may include a cross-linked polymer, if desired.

In an embodiment, the additional metal substance may include aluminum, the first semiconductor nanoparticles (or the second semiconductor nanoparticles) may include indium and phosphorus, and in the first semiconductor nanoparticle-polymer composite (or in the second semiconductor nanoparticle-polymer composite), a mole ratio of aluminum to indium may be greater than or equal to about 1:1, greater than or equal to about 5:1, or greater than or equal to about 10:1 and less than or equal to about 50:1, less than or equal to about 30:1.

In an embodiment, the additional metal substance may include zinc and the first semiconductor nanoparticles (or the second semiconductor nanoparticles) may include a zinc chalcogenide, and in the first semiconductor nanoparticle-polymer composite (or in the second semiconductor nanoparticle-polymer composite), a mole ratio of zinc to a total sum of a chalcogen element (e.g., Zn:(S+Se)) may be greater than or equal to about 1.3:1 and less than or equal to about 5:1.

In an embodiment, the first semiconductor nanoparticle-polymer composite (or the second semiconductor nanoparticle-polymer composite) may exhibit a relative luminance intensity of greater than or equal to about 60%, greater than or equal to about 80%, or greater than or equal to about 90% and less than or equal to about 110%, less than or equal to about 100%, or less than or equal to about 99.5%, after being irradiated with an incident light having a predetermined luminous intensity (for example, of greater than or equal to about 1,700,000 nit, about 8,000,000 nit to about 17,000,000 nit, or about 9,000,000 nit to about 16,000,000 nit) and a wavelength of about 420 nm or about 450 nm) for a predetermined time (e.g., about 15 minutes or 12 minutes), calculated according to the formula:

$$\text{Relative luminance intensity: } (I_{time}/I_0) \times 100\%$$

wherein
$I_{time}$ (or $I_t$) is a photoluminescence intensity of the composite at the predetermined time, for example, $I_{15}$ is a photoluminescence intensity at 15 minutes, and
$I_0$ is an initial photoluminescence intensity of the composite.

In an embodiment, a method of producing the display panel includes:
providing the color conversion panel on the light emitting panel,
wherein the color conversion panel is prepared by
obtaining, e.g., preparing, a substrate optionally having a partition wall formed on the substrate to define the first color conversion region and the second color conversion region;
depositing a first ink composition and a second ink composition in the first color conversion region and the second color conversion region, respectively, to form the first semiconductor nanoparticle-polymer composite and the second semiconductor nanoparticle-polymer composite,
wherein the first ink composition includes the first semiconductor nanoparticles, a polymer (e.g., a linear polymer or a linear copolymer) including a unit (e.g., a repeating unit) including a carboxyl group or an anion of a carboxyl group (COO⁻ moiety); and the additional metal substance;
optionally wherein the first ink composition further includes a combination of a polymerizable monomer that can provide a cross-linked polymer, a binder compound including a carboxyl group, e.g., a carboxylic acid group, the binder compound being soluble in an alkaline solution, a polymerization initiator, an organic solvent, a metal oxide particle, or a combination thereof,
wherein the additional metal substance includes a Group IIB metal, a Group IIIA metal, or a combination thereof.

In an embodiment, the second ink composition may include the second semiconductor nanoparticles, a polymer (e.g., a linear polymer or a linear copolymer) including a unit (e.g., a repeating unit) including a carboxyl group or an anion of a carboxyl group (a COO⁻ moiety); and the additional metal substance;
optionally wherein the second ink composition further includes a combination of a polymerizable monomer that can provide a cross-linked polymer, a binder compound including a carboxy group, e.g., a carboxylic acid group, the binder compound being soluble in an alkaline solution, a polymerization initiator, an organic solvent, a metal oxide particle, or a combination thereof,
wherein the additional metal substance includes a Group IIB metal, a Group IIIA metal, or a combination thereof.

In an embodiment, a method of producing a display panel includes depositing a first ink composition and a second ink composition in a first color conversion region and a second color conversion region, respectively, on a substrate, to prepare a color conversion panel; and providing the color conversion panel on a light emitting panel to produce the display panel, wherein the first ink composition includes first semiconductor nanoparticles, a polymer including a repeating unit including a carboxyl group or an anion of a carboxyl group, and an additional metal substance, wherein the second ink composition includes second semiconductor nanoparticles and a second polymer, and optionally an additional metal substance, wherein the light emitting panel is configured to provide the first color conversion region and the second color conversion region, respectively, with an incident light of an intensity of greater than or equal to about 10,000 candelas per square meter and less than or equal to about 17,000,000 candelas per square meter, wherein the first color conversion region is configured to convert the incident light to a first light, wherein the second color conversion region is configured to convert the incident light to a second light, and the second light has a maximum luminescent peak wavelength different from the first light, wherein the first color conversion region and the second color conversion region each independently have a light incident area of greater than or equal to about 1 square micrometer and less than or equal to about 1,000 square micrometers, and wherein the additional metal substance includes a Group IIB metal, a Group IIIA metal, or a combination thereof.

In an embodiment, the second polymer may include a repeating unit including a carboxyl group or an anion of a carboxyl group.

In the first ink composition, an amount of the first semiconductor nanoparticles may be greater than or equal to about 10 wt %, greater than or equal to about 20 wt %, based on a total solid content of the first ink composition, and less than or equal to about 50 wt %, or less than or equal to about 40 wt %, based on the total solid content of the first ink composition.

In the second ink composition, an amount of the second semiconductor nanoparticles may be greater than or equal to about 10 wt %, greater than or equal to about 20 wt %, and less than or equal to about 50 wt %, or less than or equal to about 40 wt %, based on a total solid content of the second ink composition.

In an embodiment, if present, an amount of the metal oxide particle may be greater than or equal to about 0.01 wt % and less than or equal to about 20 wt %, based on a total solid content of the first (or second) ink composition.

In an embodiment, an amount of the additional metal substance in the first ink composition may be greater than or equal to about 0.01 wt %, or greater than or equal to about 0.1 wt % and less than or equal to about 20 wt %, or less than or equal to about 10 wt %, based on a total weight of the first semiconductor nanoparticles.

In an embodiment, an amount of the additional metal substance in the second ink composition may be greater than or equal to about 0.01 wt %, or greater than or equal to about 0.1 wt % and less than or equal to about 20 wt %, or less than or equal to about 10 wt %, based on a total weight of the second semiconductor nanoparticles.

In an embodiment, the first ink composition may exhibit a flow temperature of greater than or equal to about 85° C.

In an embodiment, the second ink composition may exhibit a flow temperature of greater than or equal to about 85° C.

In an embodiment, an electronic device includes the display panel.

In an embodiment, the electronic device may include a portable terminal device, a monitor, a notebook personal computer (PC), a television, an electronic display, a camera, an electronic component for an automobile, or a combination thereof.

In a display panel according to an embodiment, each of micrometer-sized subpixels including semiconductor nanoparticles (e.g., quantum dots) may be provided with light, for example, independently. According to an embodiment, the display panel may achieve an improved display quality (such as an increased contrast ratio, a wider viewing angle, or a combination thereof) and may show improved reliability. According to an embodiment, an incident light of a relatively high energy is provided with an incident surface of the color conversion layer, deterioration (e.g., a photo-oxidation/bleaching or a matrix carbonization) of semiconductor nanoparticles or a composite including the same may be effectively suppressed.

BRIEF DESCRIPTION OF THE DRAWINGS

The above and other advantages and features of this disclosure will become more apparent by describing in further detail exemplary embodiments thereof with reference to the accompanying drawings, in which:

FIG. 1B is a perspective exploded view illustrating a display panel according to an embodiment.

FIG. 4C is a schematic cross-sectional view illustrating the color conversion panel.

DETAILED DESCRIPTION

Figure 1A:
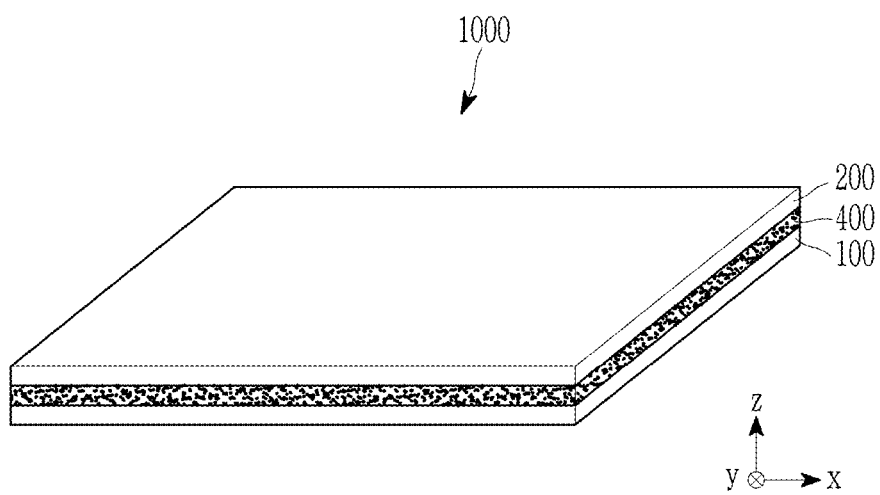
FIG. 1A is a perspective view illustrating a display panel including a color conversion panel according to an embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art.

If not defined otherwise, a term (including a technical or scientific term) in the specification may be defined as commonly understood by one skilled in the art. It will be further understood that terms, such as those defined in commonly used, e.g., non-technical, dictionaries, should be interpreted as having a meaning that is consistent with their meaning in the context of the relevant art and the present disclosure, and will not be interpreted in an idealized or overly formal sense unless expressly so defined herein.

In the drawings, the thickness of layers, films, panels, regions, etc., are exaggerated for clarity. Like reference numerals designate like elements throughout the specification.

Further, in the drawings, size and thickness of each element may be arbitrarily represented for better understanding and ease of description, but the present disclosure is not limited thereto. In the drawings, the thickness of layers, films, panels, regions, etc., may be exaggerated for clarity. In addition, in the drawings, for better understanding and ease of description, the thickness of some layers and areas may be exaggerated.

It will be understood that when an element such as a layer, film, region, or substrate is referred to as being "on" another element, it can be directly on the other element or intervening elements may also be present. In contrast, when an element is referred to as being "directly on" another element, there are no intervening elements present. The word "on" or "above" means being on or below the object portion, and does not necessarily mean being on the upper side of the object portion based on a gravitational direction.

It will be understood that, although the terms "first," "second," "third" etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "a first component," "a first region," "a first layer" or "a first section" discussed below could be termed a second element, a second component, a second region, a second layer or a second section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items.

It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

In addition, in this specification, the phrase "on a plane" or "in a plane" or "plan view" means viewing a target portion from the top, and the phrase "on a cross-section" or "in a cross-section" or "cross-sectional view" means viewing a cross-section formed by vertically cutting a target portion from the side.

"About" as used herein is inclusive of the stated value and means within an acceptable range of deviation for the particular value as determined by one of ordinary skill in the art, taking to consideration the measurement in question and the error associated with measurement of the particular quantity (i.e., the limitations of the measurement system). For example, "about" can mean within one or more standard deviations, or within ±10%, ±5%, ±3%, or ±1% of the stated value.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated May be rounded. Thus, the regions illustrated in the figures are schematic in nature and their shapes are not intended to illustrate the precise shape of a region and are not intended to limit the scope of the present claims.

As used herein, the average (value) may be mean or median. In an embodiment, the average (value) may be a mean average.

As used herein, when a definition is not otherwise provided, "substituted" may refer to replacement of hydrogen of a compound or a group by a substituent of a C1 to C30 alkyl group, a C2 to C30 alkenyl group, a C2 to C30 alkynyl group, a C6 to C30 aryl group, a C7 to C30 alkylaryl group, a C1 to C30 alkoxy group, a C1 to C30 heteroalkyl group, a C3 to C30 heteroalkylaryl group, a C3 to C30 cycloalkyl group, a C3 to C15 cycloalkenyl group, a C6 to C30 cycloalkynyl group, a C2 to C30 heterocycloalkyl group, a halogen (—F, —Cl, —Br, or —I), a hydroxy group (—OH), a nitro group (—NO$_2$), a cyano group (—CN), an amino group (—NRR' wherein R and R' are independently hydrogen or a C1 to C6 alkyl group), an azido group (—N$_3$), an amidino group (—C(=NH)NH$_2$), a hydrazino group (—NHNH$_2$), a hydrazono group (=N(NH$_2$)), an aldehyde group (—C(=O) H), a carbamoyl group (—C(O) NH$_2$), a thiol group (—SH), an ester group (—C(=O) OR, wherein R is a C1 to C6 alkyl group or a C6 to C12 aryl group), a carboxyl group (—COOH) or a salt thereof (—C(=O) OM, wherein M is an organic or inorganic cation), a sulfonic acid group (—SO$_3$H) or a salt thereof (—SO$_3$M, wherein M is an organic or inorganic cation), a phosphoric acid group (—PO$_3$H$_2$) or a salt thereof (—PO$_3$MH or —PO$_3$M$_2$, wherein M is an organic or inorganic cation), or a combination thereof. The indicated number of carbon atoms in a group is exclusive of any substituents, e.g., a cyanoethyl group is a C2 hydrocarbon group substituted with a cyano group.

As used herein, the term "Group" may refer to a group of Periodic Table.

As used herein, "Group I" refers to Group IA and Group IB, and examples may include Li, Na, K, Rb, and Cs, but are not limited thereto.

As used herein, "Group II" refers to Group IIA and Group IIB, and examples of Group II metal may be Cd, Zn, Hg, and Mg, but are not limited thereto.

As used herein, "Group III" refers to Group IIIA and Group IIIB, and examples of Group IIIA metal may be Al, In, Ga, and Tl, and examples of Group IIIB may be scandium, yttrium, or the like, but are not limited thereto.

As used herein, "Group IV" refers to Group IVA and Group IVB, and examples of a Group IVA metal may be Si, Ge, and Sn, and examples of Group IVB metal may be titanium, zirconium, hafnium, or the like, but are not limited thereto. As used herein, "metal" includes a semi-metal such as Si.

As used herein, "Group V" includes Group VA and includes nitrogen, phosphorus, arsenic, antimony, and bismuth, but is not limited thereto.

As used herein, "Group VI" includes Group VIA and includes sulfur, selenium, and tellurium, but is not limited thereto.

As used herein, when a definition is not otherwise provided, a hydrocarbon or hydrocarbon group refers to a compound or a group including (or consisting of) carbon and hydrogen (e.g., an alkyl, alkenyl, alkynyl, or aryl group). The hydrocarbon group may be a group having a valence of one or greater formed by removal of a, e.g., at least one, hydrogen atom from alkane, alkene, alkyne, or arene. In the hydrocarbon group, a, e.g., at least one, methylene may be replaced by an oxide moiety, a carbonyl moiety, an ester moiety, —NH—, or a combination thereof. In an embodiment, a hydrocarbon group may not be substituted with a carboxylic acid or an anion thereof (carboxylate group).

As used herein, when a definition is not otherwise provided, "aliphatic" may refer to a saturated or unsaturated linear or branched hydrocarbon group. An aliphatic group may be an alkyl, alkenyl, or alkynyl group, for example.

As used herein, when a definition is not otherwise provided, "alkyl" refers to a linear or branched saturated monovalent hydrocarbon group (methyl, ethyl, hexyl, etc.). In an embodiment, an alkyl group may have from 1 to 50 carbon atoms, or 1 to 18 carbon atoms, or 1 to 12 carbon atoms, or 1 to 6 carbon atoms.

As used herein, when a definition is not otherwise provided, "alkenyl" refers to a linear or branched monovalent hydrocarbon group having one or more carbon-carbon double bond. In an embodiment, an alkenyl group may have from 2 to 50 carbon atoms, or 2 to 18 carbon atoms, or 2 to 12 carbon atoms, or 2 to 6 carbon atoms.

As used herein, when a definition is not otherwise provided, "alkynyl" refers to a linear or branched monovalent hydrocarbon group having one or more carbon-carbon triple bond. In an embodiment, an alkenyl group may have from 2 to 50 carbon atoms, or 2 to 18 carbon atoms, or 2 to 12 carbon atoms.

As used herein, when a definition is not otherwise provided, "aromatic" refers to an organic compound or group including a, e.g., at least one, unsaturated cyclic group having delocalized pi electrons. The term encompasses both hydrocarbon aromatic compounds and heteroaromatic compounds.

As used herein, when a definition is not otherwise provided, "aryl" refers to a group formed by removal of a, e.g., at least one, hydrogen from an aromatic hydrocarbon (e.g., a phenyl or naphthyl group). In an embodiment, an aryl group may have from 6 to 50 carbon atoms, or 6 to 18 carbon atoms, or 6 to 12 carbon atoms.

As used herein, when a definition is not otherwise provided, "hetero" refers to including one or more (e.g., 1 to 3) heteroatom of N, O, S, Si, P, or a combination thereof.

As used herein, when a definition is not otherwise provided, "alkoxy" means an alkyl group linked via an oxygen (i.e., alkyl-O—), such as a methoxy, ethoxy, or sec-butyloxy group.

As used herein, when a definition is not otherwise provided, "amine" or "amine group" may be represented by —NRR, wherein each R is independently hydrogen, a C1 to C12 alkyl group, a C7 to C20 alkylarylene group, a C7 to C20 arylalkylene group, or a C6 to C18 aryl group.

As used herein, when a definition is not otherwise provided, "alkylene group" refers to a straight or branched saturated aliphatic hydrocarbon group having at least two valences and optionally substituted with a, e.g., at least one, substituent. The alkylene group may have from 1 to 12, or 1 to 8, or 1 to 6 carbon atoms.

As used herein, when a definition is not otherwise provided, "arylene group" refers to a functional group having at least two valences obtained by removal of at least two hydrogens in an, e.g., at least one, aromatic ring, and optionally substituted with a, e.g., at least one, substituent.

As used herein, a carboxyl group (e.g., represented by "COO") is inclusive of carboxylic acid groups (COOH) and carboxyl anions (COO$^-$) groups. In an embodiment, such groups may be present in a complexed or salt form, which are included in the definition of carboxy.

As used herein, when a definition is not otherwise provided, "(meth)acrylate" refers to acrylate, methacrylate, or a combination thereof. The (meth)acrylate may include a (C1 to C10 alkyl) acrylate, a (C1 to C10 alkyl) methacrylate, or a combination thereof.

As used herein, "poly(meth)acryl refers to a polyacrylic acid or the anion thereof, a polymethacrylic acid or an anion thereof, or a combination thereof.

As used herein, the term "chalcogenide" is inclusive of sulfur (S), selenium (Se), and tellurium (Te). In an embodiment, the term "chalcogenide" may include or may not include oxygen (O).

As used herein, when a definition is not otherwise provided, the expression "not including cadmium (or other harmful heavy metal)" may refer to the case in which a concentration of each of cadmium (or another heavy metal deemed harmful) may be less than or equal to about 100 parts per million by weight (ppmw), less than or equal to about 50 ppmw, less than or equal to about 10 ppmw, less than or equal to about 1 ppmw, less than or equal to about 0.1 ppmw, less than or equal to about 0.01 ppmw, or about zero. In an embodiment, substantially no amount of cadmium (or other heavy metal) may be present or, if present, an amount of cadmium (or other heavy metal) may be less than or equal to a detection limit or as an impurity level of a given analysis tool (e.g., an inductively coupled plasma atomic emission spectroscopy).

As used herein, a nanostructure or a nanoparticle is a structure having a, e.g., at least one, region or characteristic dimension with a dimension of less than or equal to about 500 nm. In an embodiment, a dimension (or an average) of the nanoparticles is less than or equal to about 300 nm, less than or equal to about 250 nm, less than or equal to about 150 nm, less than or equal to about 100 nm, less than or equal to about 50 nm, or less than or equal to about 30 nm. In an embodiment, the structure may have any suitable shape.

The (semiconductor) nanoparticle may include a nanowire, a nanorod, a nanotube, a branched nanostructure, a nanotetrapod, a nanotripod, a nanobipod, a nanocrystal, a nanodot, a multi-pod type shape such as at least two pods, or the like and is not limited thereto. The nanoparticle can be, e.g., substantially crystalline, substantially monocrystalline, polycrystalline, (for example, at least partially) amorphous, or a combination thereof.

In an embodiment, a semiconductor nanoparticle or a quantum dot may exhibit quantum confinement or exciton confinement. As used herein, the term "quantum dot" or "semiconductor nanoparticle" is not limited in a shape thereof unless otherwise defined. A quantum dot or a semiconductor nanoparticle may have a size smaller than a Bohr excitation diameter for a bulk crystal material having an identical composition and may exhibit a quantum confinement effect. The quantum dot or the semiconductor nanoparticle may emit light corresponding to a bandgap energy thereof by controlling a size of a nanocrystal acting as an emission center.

In an embodiment, the "cross-section" of a given object (e.g., a panel or a pixel) may be taken along a long axis or a short axis of a planar surface thereof (for example, a front surface or a top surface) of the given object.

As used herein, an "aperture ratio" of a pixel is related to a transparent region in a pixel design and may refer to a ratio of a light-sensitive area of a pixel to a total area of that pixel.

As used herein, a light extraction surface (for example of a light emitting unit) is a surface that is configured to emit light (see FIG. 1B and FIG. 4). In an embodiment, (for example, as determined in a cross-section of a panel), the light extraction surface may be substantially vertical to a light progress direction, e.g., a direction in which light travels (e.g., z direction in figures), or may be substantially parallel to a bottom surface of the panel, but is not limited thereto.

In an embodiment, a width of a color conversion region may be a distance between sidewalls constituting a partition wall.

As used herein, the term "combination" may refer to a mixture (e.g., homogeneous or inhomogeneous one), a laminated structure of two or more, or a combined range. As used herein, the upper and lower endpoints set forth for various values may be independently combined to provide a range.

In an embodiment, a luminescent peak wavelength or other photoluminescent properties may be readily and reproducibly measured by using a spectrophotometer (e.g., Hitachi F-7000 spectrophotometer or Quantaurus-QY Plus ultraviolet (UV)-near infrared (NIR) absolute PL quantum yield spectrometer from Hamamatsu).

In an embodiment, luminance is a photometric measure of the luminous intensity per unit area of light travelling in a given direction (for example, reaching a given object). Luminance describes the amount of light that passes through or arrives at or is emitted from. The luminance may be readily and reproducibly measured by using an appropriate equipment for example spectroradiometer (e.g., CS-2000 or CS-2000A from Konica Minolta) according to a manual provided from a manufacturer.

Hereinafter, a display panel according to an embodiment will be described.

Figure 2:
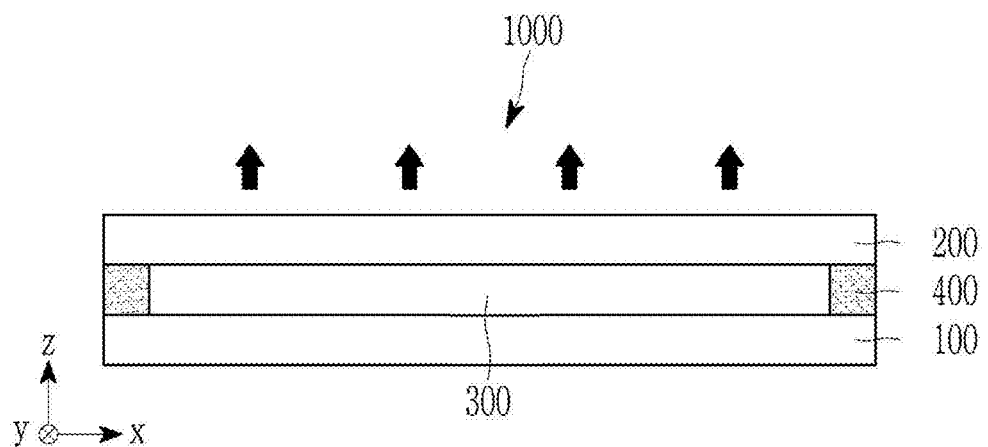
FIG. 2 is a cross-sectional view of the display panel of FIG. 1A.

FIG. 1A and FIG. 1B are a perspective view and a perspective exploded view each illustrating a display panel according to an embodiment. FIG. 2 is a cross-sectional view of the display panel of FIG. 1A, FIG. 3 is a plan view illustrating an arrangement of pixels of the display panel of FIG. 1A, and FIG. 4 is a cross-sectional view of the display panel of FIG. 3 taken along line IV-IV.

An embodiment is explained referring to each of FIG. 1A, FIG. 1B, and FIG. 2. In an embodiment, the display panel 1000 according to an embodiment include a light emitting panel 100 and a color conversion panel 200. The display panel according to an embodiment may further include a light transmitting layer 300 between the light emitting panel 100 and the color conversion panel 200, a binding element 400 for combining the light emitting panel 100 and the color conversion panel 200, or a combination thereof. In an embodiment, the light transmitting layer 300 may be for example a filling material, may include an organic material, an inorganic material, an organic-inorganic material, or a combination thereof, and for example, may include an epoxy resin, a silicone compound, a polyorganosiloxane, or a combination thereof, but is not limited thereto.

The light emitting panel 100 and the color conversion panel 200 may face each other (optionally, with the light transmitting layer 300 therebetween), and the color conversion panel 200 may be disposed in a direction in which light is emitted from the light emitting panel 100 or in a light progress direction. In a display panel according to an embodiment, a manner of disposing a binding element 400 is not particularly limited. In an embodiment, a binding element 400 may be disposed along the edges of the light emitting panel 100 and the color conversion panel 200. In an embodiment, the binding element 400 may be, for example, a sealant. In a display panel according to an embodiment, a binding element 400 may be an adhesive such as an optically clear adhesive and a binding element 400 or the adhesive may be disposed along at least a portion of a surface of the light emitting panel and at least a portion of a surface of the color conversion panel to combine the light emitting panel and the color conversion panel.

Figure 3:
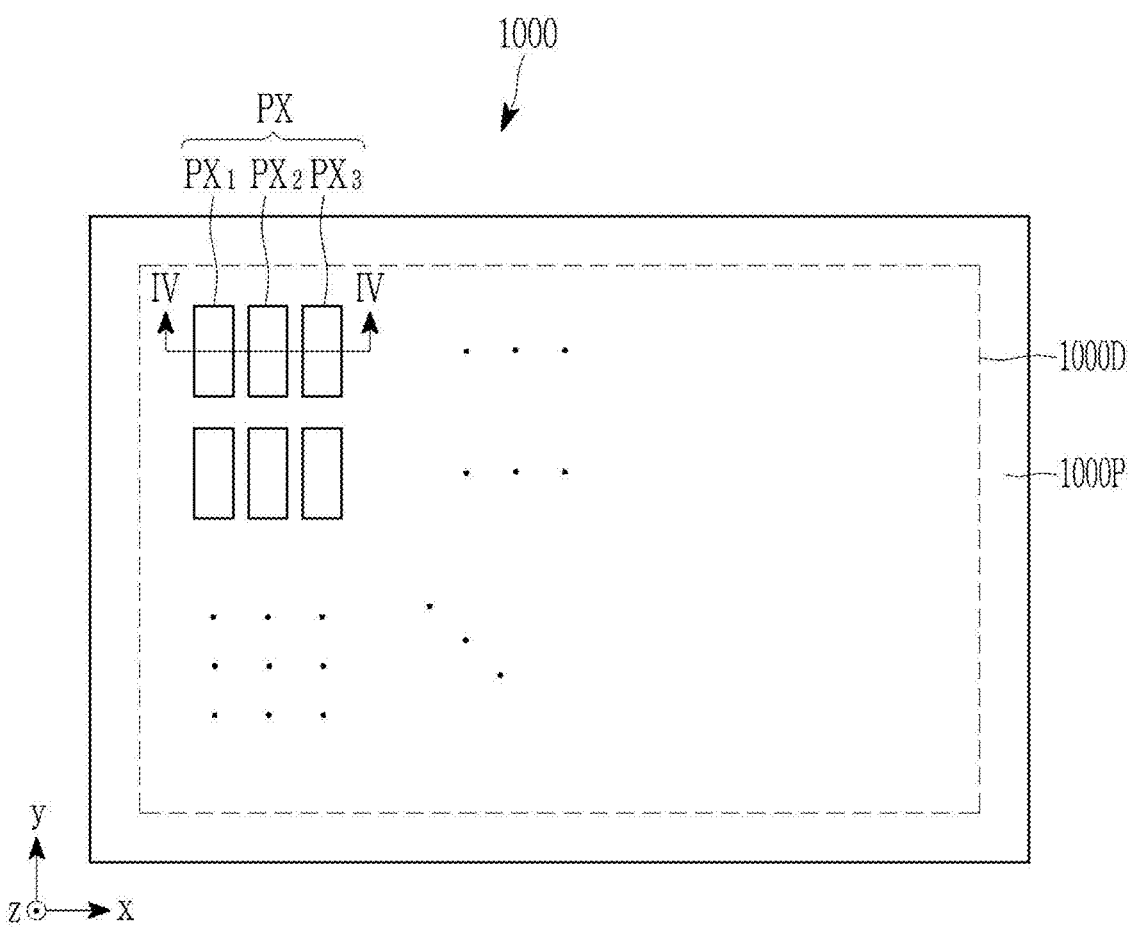
FIG. 3 is a plan view illustrating a pixel arrangement of a display panel according to an embodiment.

Referring to FIG. 3, a display panel 1000 according to an embodiment May include a display area 1000D for displaying an image and a non-display area 1000P around the display area 1000D where the binding element 400 may be located.

The display area 1000D may include a plurality of pixels PXs arranged along a row (e.g., x direction), a column (e.g., y direction), or a combination thereof, and each pixel PX may include a plurality of sub-pixels $PX_1$, $PX_2$, and $PX_3$ displaying different colors. In FIG. 3, an embodiment having a configuration in which three sub-pixels $PX_1$, $PX_2$, and $PX_3$ constitute one pixel PX is illustrated, but the configuration is not limited thereto. An additional sub-pixel such as a white sub-pixel may be further included, and one or more sub-pixel that display a same color may be included. The plurality of pixels PXs may be arranged in, for example, a Bayer matrix form, a PenTile matrix form, a diamond matrix form, or a combination thereof, but is not limited thereto Each of the sub-pixels $PX_1$, $PX_2$, and $PX_3$ may display a color of three primary colors or a combination of three primary colors, for example, green, red, blue, or a combination thereof. In an embodiment, the first sub-pixel $PX_1$ may display green (or red), the second sub-pixel $PX_2$ may display red (or green), and the third sub-pixel $PX_3$ may display blue.

In the drawings, an embodiment in which all sub-pixels have a same size as each other is illustrated, but the disclosure is not limited thereto. A, e.g., at least one, of the sub-pixels may be larger or smaller than the other sub-pixels. In the drawings, an embodiment in which all sub-pixels have a same shape as each other may be illustrated, but the disclosure is not limited thereto. A, e.g., at least one, of the sub-pixels may have a different shape from other sub-pixels.

Figure 4A:
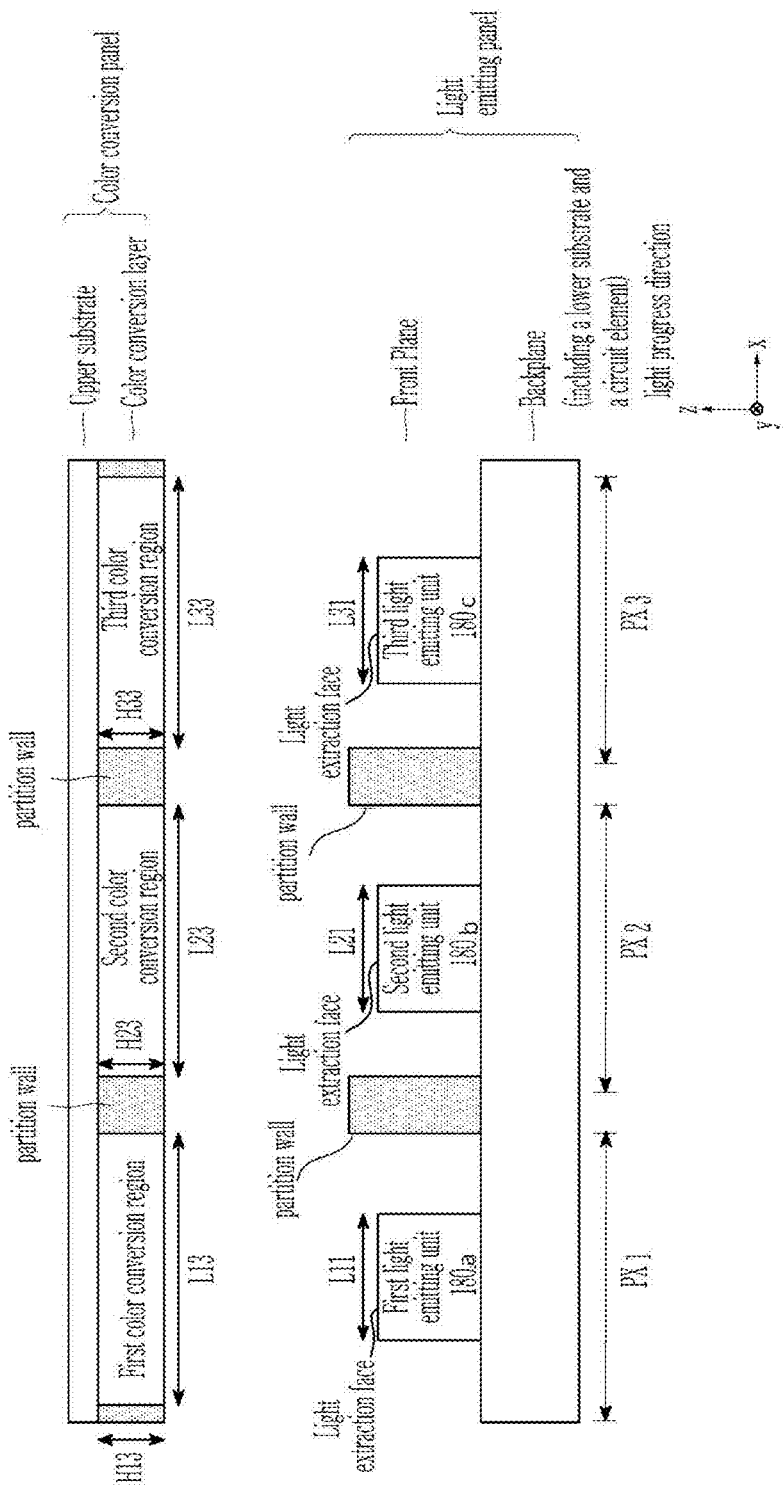
FIG. 4A is a schematic cross-sectional view of the display panel of FIG. 3 taken along line IV-IV.
Figure 4B:
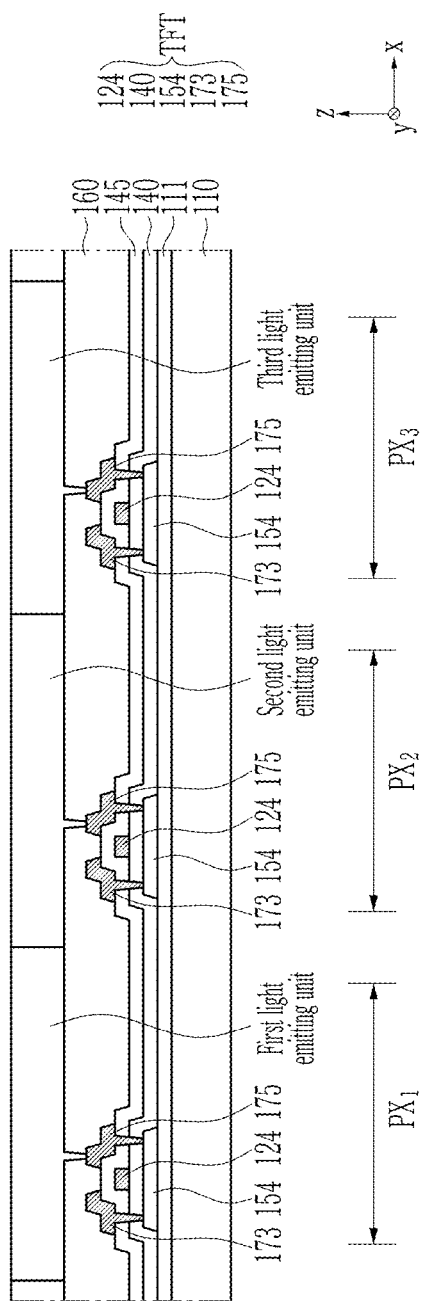
FIG. 4B is a schematic cross-sectional view illustrating the backplane of FIG. 4A in detail, in a display device of an embodiment.
Figure 5:
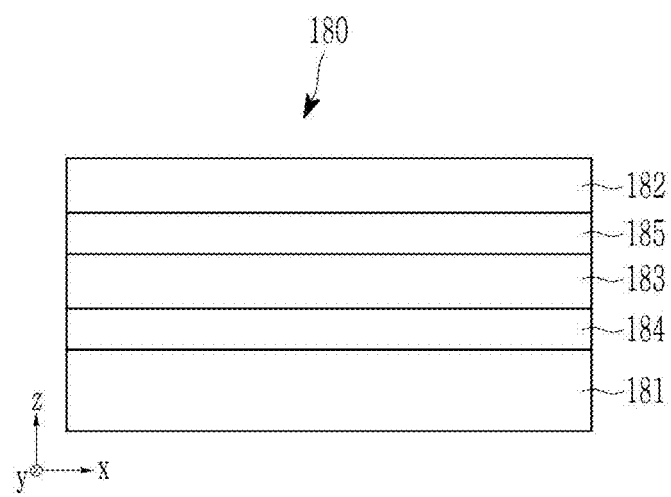
FIG. 5 is a cross-sectional view illustrating a light emitting unit in a display panel according to an embodiment.

A size of a pixel may be appropriately selected. A dimension of a pixel (e.g., a pixel width, a pixel length, or a combination thereof) may be greater than or equal to about 100 µm, greater than or equal to about 150 µm, greater than or equal to about 200 µm, greater than or equal to about 250 µm, greater than or equal to about 300 µm, greater than or equal to about 350 µm, greater than or equal to about 400 µm, greater than or equal to about 450 µm, greater than or equal to about 500 µm, greater than or equal to about 550 µm, greater than or equal to about 600 µm, greater than or equal to about 650 µm, greater than or equal to about 700 µm, greater than or equal to about 750 µm, greater than or equal to about 800 µm, or greater than or equal to about 850 µm. A dimension of a pixel (e.g., a pixel width, a pixel length, or a combination thereof) of a pixel may be less than or equal to about 2,000 µm, less than or equal to about 1,500 µm, less than or equal to about 1,000 µm, or less than or equal to about 500 µm. Referring to FIG. 4A, FIG. 4B, and FIG. 5, the light emitting panel 100 and the color conversion panel 200 will be described.

The light emitting panel 100 may include a plurality of light emitting units 180 (shown in FIG. 5), each of which emits light of a predetermined wavelength spectrum.

The light emitting units 180 (e.g., a first light emitting unit 180a, a second light emitting unit 180b, and a third light emitting unit 180c) may be disposed to correspond to the sub-pixels $PX_1$, $PX_2$, and $PX_3$, respectively. The front plane of the light emitting panel may face the color conversion panel. The light emitting panel may include a back plane below the front plane. Light may be emitted from the light extraction surface (e.g., light extraction face in FIG. 4A) of the light emitting unit and the emitted light may progress, e.g., travel, in direction z or a thickness direction of the light emitting panel 100 to the color conversion panel 200. (See FIG. 4A, and FIG. 4B).

Each of the plurality of light emitting units 180a, 180b, 180c may be the same as or different from each other. In an embodiment, the light emitting units 180a, 180b, 180c may be disposed corresponding to the sub-pixels $PX_1$, $PX_2$, and $PX_3$, respectively, and may emit light of same or different wavelength spectrum. In an embodiment, each of the light emitting units 180 corresponding to the sub-pixels $PX_1$, $PX_2$, and $PX_3$ may emit light of a same wavelength spectrum. In an embodiment, the plurality of light emitting units may emit an incident light.

In an embodiment, a luminescent peak wavelength of the incident light may be greater than or equal to about 360 nanometers (nm), greater than or equal to about 400 nm, or greater than or equal to about 440 nm. The luminescent peak wavelength of the incident light may be less than about 500 nm, less than or equal to about 480 nm, or less than or equal to about 470 nm. In an embodiment, the light emitting unit may emit light of a blue wavelength spectrum, and the maximum luminescent peak wavelength of the blue light may be in a range of about 400 nm to about 500 nm, or may be greater than or equal to about 400 nm and less than about 500 nm. The luminescent peak wavelength of the incident light (or the blue light) may be in a range of about 360 nm to about 500 nm, in a range of about 410 nm to about 490 nm, in a range of about 420 nm to about 495 nm or in a range of about 430 nm to about 480 nm, or in a range of about 440 nm to about 470 nm, or a combination thereof.

The luminescent peak wavelength of the incident light may be selected appropriately taking into consideration a desired light intensity of the light emitting unit, semiconductor nanoparticles included in the color conversion panel, an aperture, or a combination thereof.

The plurality of the light emitting units may be arranged to form an array (see FIG. 1B)

In an embodiment, for example, in a cross-section of the display panel, a dimension (e.g., a length or width) of the light extraction surface of the light emitting unit (for example, a first light emitting unit 180a, a second light emitting unit 180b, and a third light emitting unit 180c, hereinafter, simply referred to as "light emitting unit") L11, L21, L31 may be greater than or equal to about 500 nm, greater than or equal to about 900 nm, greater than or equal to about 1 micrometer (µm), greater than or equal to about 1.5 µm, greater than or equal to about 2 µm, greater than or equal to about 2.5 µm, greater than or equal to about 3 µm, greater than or equal to about 3.5 μm, greater than or equal to about 4 μm, greater than or equal to about 4.5 μm, greater than or equal to about 5 μm, greater than or equal to about 5.5 μm, greater than or equal to about 6 μm, greater than or equal to about 6.5 μm, greater than or equal to about 7 μm, greater than or equal to about 7.5 μm, greater than or equal to about 8 μm, greater than or equal to about 8.5 μm, greater than or equal to about 9 μm, greater than or equal to about 9.5 μm, greater than or equal to about 10 μm, greater than or equal to about 13 μm, greater than or equal to about 15 μm, greater than or equal to about 17 μm, greater than or equal to about 19 μm, greater than or equal to about 20 μm, greater than or equal to about 21 μm, greater than or equal to about 24 μm, greater than or equal to about 25 μm, greater than or equal to about 27 μm, greater than or equal to about 29 μm, greater than or equal to about 30 μm, greater than or equal to about 31 μm, greater than or equal to about 33 μm, greater than or equal to about 35 μm, greater than or equal to about 37 μm, greater than or equal to about 39 μm, greater than or equal to about 40 μm, greater than or equal to about 41 μm, greater than or equal to about 43 μm, greater than or equal to about 45 μm, greater than or equal to about 47 μm, greater than or equal to about 49 μm, or greater than or equal to about 50 μm.

In an embodiment, for example, in a cross-section of the display panel, a length of the light extraction surface may be a length of a longest straight line extending substantially parallel to a bottom surface of the panel, but is not limited thereto. In an embodiment, a length of a light emitting surface of a given light emitting unit may be a dimension (e.g., a diameter of a circle or a side length of a polygon) thereof, but is not limited thereto. In an embodiment, a light emitting unit may include a microsized light emitting diode (μ-LED), quantum nano light-emitting diode (QNED), or a combination thereof, and the dimension of the light emitting surface of the unit may be determined taking into consideration a desired pixel per inch (PPI) of the display device.

In the light emitting unit, a dimension (e.g., a length) of the light extraction surface or a dimension of light emitting surface of the light emitting unit (hereinafter referred to as a dimension of individual light source at times) L11, L21, L31 may be in a micrometer scale. The length of the light extraction surface of the light emitting unit may be less than or equal to about 100 μm, less than or equal to about 90 μm, less than or equal to about 85 μm, less than or equal to about 80 μm, less than or equal to about 75 μm, less than or equal to about 70 μm, less than or equal to about 65 μm, less than or equal to about 60 μm, less than or equal to about 55 μm, less than or equal to about 50 μm, less than or equal to about 45 μm, less than or equal to about 40 μm, less than or equal to about 35 μm, less than or equal to about 30 μm, less than or equal to about 25 μm, less than or equal to about 20 μm, less than or equal to about 15 μm, less than or equal to about 10 μm, or less than or equal to about 5 μm. The dimension of individual light source, L11, L21, L31 may be greater than or equal to about 1 μm, greater than or equal to about 3 μm, greater than or equal to about 5 μm, greater than or equal to about 7 μm, greater than or equal to about 9 μm, greater than or equal to about 10 μm, greater than or equal to about 15 μm, greater than or equal to about 20 μm, greater than or equal to about 25 μm, greater than or equal to about 30 μm, or greater than or equal to about 35 μm.

The light emitting units may be spaced apart each other and a gap between adjacent light emitting units may be determined in light of a pixel size, a subpixel size, or the like. In an embodiment, a gap between the adjacent light emitting units may be greater than or equal to about 10 μm, greater than or equal to about 20 μm, greater than or equal to about 30 μm, greater than or equal to about 40 μm, greater than or equal to about 50 μm, greater than or equal to about 60 μm, greater than or equal to about 70 μm, greater than or equal to about 80 μm, greater than or equal to about 90 μm, greater than or equal to about 100 μm, greater than or equal to about 110 μm, greater than or equal to about 120 μm, greater than or equal to about 130 μm, greater than or equal to about 140 μm, greater than or equal to about 150 μm, greater than or equal to about 160 μm, greater than or equal to about 170 μm, greater than or equal to about 180 μm, greater than or equal to about 190 μm, or greater than or equal to about 200 μm. The gap between the adjacent light emitting units may be less than or equal to about 600 μm, less than or equal to about 550 μm, less than or equal to about 500 μm, less than or equal to about 450 μm, less than or equal to about 400 μm, less than or equal to about 350 μm, less than or equal to about 300 μm, less than or equal to about 250 μm, less than or equal to about 200 μm, less than or equal to about 150 μm, less than or equal to about 100 μm, or less than or equal to about 50 μm.

The light extraction surface (e.g., a front surface or a top surface) of an individual light emitting unit may have any suitable shape, which is not particularly limited. A shape of the light extraction surface may include a polygon shape such as a trigonal shape, a tetragonal shape (e.g., a square, a rectangle, or the like), a pentagon shape, a circle, an ellipse, or a combination thereof.

An area of the light extraction surface may be less than or equal to about 5,000 $\mu m^2$, less than or equal to about 4,000 $\mu m^2$, less than or equal to about 3,000 $\mu m^2$, less than or equal to about 2,000 $\mu m^2$, less than or equal to about 1,000 $\mu m^2$, less than or equal to about 900 $\mu m^2$, less than or equal to about 800 $\mu m^2$, less than or equal to about 700 $\mu m^2$, less than or equal to about 600 $\mu m^2$, less than or equal to about 500 $\mu m^2$, less than or equal to about 400 $\mu m^2$, less than or equal to about 300 $\mu m^2$, less than or equal to about 250 $\mu m^2$, less than or equal to about 200 $\mu m^2$, or less than or equal to about 100 $\mu m^2$.

An area of the light extraction surface may be greater than or equal to about 0.25 $\mu m^2$, greater than or equal to about 0.5 $\mu m^2$, greater than or equal to about 1 $\mu m^2$, greater than or equal to about 3 $\mu m^2$, greater than or equal to about 5 $\mu m^2$, greater than or equal to about 7 $\mu m^2$, greater than or equal to about 10 $\mu m^2$, greater than or equal to about 11 $\mu m^2$, greater than or equal to about 13 $\mu m^2$, greater than or equal to about 15 $\mu m^2$, greater than or equal to about 19 $\mu m^2$, greater than or equal to about 20 $\mu m^2$, greater than or equal to about 21 $\mu m^2$, greater than or equal to about 23 $\mu m^2$, greater than or equal to about 25 $\mu m^2$, greater than or equal to about 27 $\mu m^2$, greater than or equal to about 29 $\mu m^2$, greater than or equal to about 30 $\mu m^2$, greater than or equal to about 31 $\mu m^2$, greater than or equal to about 33 $\mu m^2$, greater than or equal to about 35 $\mu m^2$, greater than or equal to about 37 $\mu m^2$, greater than or equal to about 39 $\mu m^2$, greater than or equal to about 40 $\mu m^2$, greater than or equal to about 41 $\mu m^2$, greater than or equal to about 43 $\mu m^2$, greater than or equal to about 45 $\mu m^2$, greater than or equal to about 47 $\mu m^2$, greater than or equal to about 49 $\mu m^2$, greater than or equal to about 50 $\mu m^2$, greater than or equal to about 55 $\mu m^2$, greater than or equal to about 60 $\mu m^2$, greater than or equal to about 65 $\mu m^2$, greater than or equal to about 70 $\mu m^2$, greater than or equal to about 75 $\mu m^2$, greater than or equal to about 80 $\mu m^2$, greater than or equal to about 85 $\mu m^2$, greater than or equal to about 90 $\mu m^2$, greater than or equal to about 95 $\mu m^2$, greater than or equal to about 100 $\mu m^2$, greater than or equal to about 120 $\mu m^2$, greater than or equal to about 140 µm², greater than or equal to about 160 µm², greater than or equal to about 180 µm², greater than or equal to about 200 µm², greater than or equal to about 250 µm², greater than or equal to about 300 µm², greater than or equal to about 350 µm², greater than or equal to about 400 µm², greater than or equal to about 450 µm², or greater than or equal to about 500 µm².

A cross-section of the light emitting unit may have any suitable shape, which is not particularly limited. A shape of the cross-section of the light emitting unit may be a square, a rectangle, a trapezoid, a rhombus, a parallelogram, or the like.

In an embodiment, the light emitting units (e.g., a first light emitting unit 180a and a second light emitting unit 180b included in the light emitting panel) may be spaced apart from another. A partition wall (e.g., a passivation layer or a bank layer) or a pixel defining layer may be disposed between the first light emitting unit and the second light emitting unit. The partition wall may be disposed for at least a portion of the partition wall to overlap a first partition wall, a second partition wall, or both that will be described herein, e.g., disposed such that at least a portion of the partition wall overlaps a first partition wall, a second partition wall, or both. A material for the partition wall, the passivation layer, or a bank layer may include an organic material, an inorganic material, or a combination thereof, and is not particularly limited. In an embodiment, details of the partition wall may refer to a description for a partition wall included in a color conversion layer, which is described herein.

Referring to FIG. 4B, a backplane of the light emitting panel may include, for example, a lower substrate 110, and a circuit element for switching the light emitting units, driving the light emitting units, or a combination thereof. In an embodiment, the light emitting units may be individually or independently controlled.

In an embodiment, the light emitting panel 100 may include a lower substrate 110, a buffer layer 111, a thin film transistor (TFT), a light emitting unit 180, and an encapsulation layer.

The lower substrate 110 may be an inorganic material substrate (e.g., a glass substrate), an organic-inorganic hybrid substrate, a metal substrate, an organic material substrate (e.g., a polymer substrate) or a combination thereof. In an embodiment, the lower substrate may be a polymer substrate. The polymer substrate may include, for example, polyimide, polyamide, poly (amide-imide), polyethylene terephthalate, polyethylene naphthalene, polymethyl methacrylate, polycarbonate, a copolymer thereof, or a combination thereof, but is not limited thereto.

The buffer layer 111 may include an organic material, an inorganic material, or an organic-inorganic material. The buffer layer 111 may include, for example, an oxide, a nitride, or an oxynitride, and may include, for example, silicon oxide, silicon nitride, silicon oxynitride, or a combination thereof, but is not limited thereto. The buffer layer 111 may be one layer (i.e., a single layer structure) or two or more layers (i.e., a multilayer structure), and may cover a portion of or the entire surface of the lower substrate 110. The buffer layer 111 may be omitted.

The thin film transistor (TFT) may be a three-terminal element for switching the light emitting unit 180, driving the light emitting unit 180, or a combination thereof, and one or two or more may be included for each sub-pixel. The thin film transistor (TFT) may include a gate electrode 124, a semiconductor layer 154 overlapping the gate electrode 124, a gate insulating layer 140 between the gate electrode 124 and the semiconductor layer 154, and a source electrode 173 and a drain electrode 175 electrically connected to the semiconductor layer 154. In the drawings, a coplanar top gate structure is shown as an embodiment, but the structure is not limited thereto and may have various structures.

The gate electrode 124 may be electrically connected to a gate line (not shown), and may include, for example, a low-resistance metal such as aluminum (Al), molybdenum (Mo), copper (Cu), titanium (Ti), silver (Ag), gold (Au), an alloy thereof, or a combination thereof, but is not limited thereto.

The semiconductor layer 154 may be an inorganic semiconductor such as amorphous silicon, polycrystalline silicon, or oxide semiconductor; an organic semiconductor; an organic-inorganic semiconductor; or a combination thereof. For example, the semiconductor layer 154 may include an oxide semiconductor including indium (In), zinc (Zn), tin (Sn), gallium (Ga), or a combination thereof, and the oxide semiconductor may include, for example, indium-gallium-zinc oxide, zinc-tin oxide, or a combination thereof, but not being limited thereto. The semiconductor layer 154 may include a channel region and doped regions disposed on opposing sides of the channel region and electrically connected to the source electrode 173 and the drain electrode 175, respectively.

The gate insulating layer 140 may include an organic material, an inorganic material, or an organic-inorganic material, and may include, for example, an oxide, a nitride, or an oxynitride, and may include, for example, silicon oxide, silicon nitride, silicon oxynitride, or a combination thereof, but is not limited thereto. In the drawing, an embodiment in which the gate insulating layer 140 is disposed or formed on the entire surface of the lower substrate 110 is illustrated, but the disclosure is not limited thereto and may be selectively formed between the gate electrode 124 and the semiconductor layer 154. The gate insulating layer 140 may be formed of (or defined by) one layer or two or more layers.

The source electrode 173 and the drain electrode 175 may include, for example, a low-resistance metal such as aluminum (Al), molybdenum (Mo), copper (Cu), titanium (Ti), silver (Ag), gold (Au), an alloy thereof, or a combination thereof, but are not limited thereto. The source electrode 173 and the drain electrode 175 may be electrically connected to the doped regions of the semiconductor layer 154, respectively. The source electrode 173 is electrically connected to a data line (not shown), and the drain electrode 175 is electrically connected to a light emitting unit 180 to be described herein.

An interlayer insulating layer 145 may be additionally disposed or formed between the gate electrode 124 and the source/drain electrodes 173 and 175. The interlayer insulating layer 145 may include an organic material, an inorganic material, or an organic-inorganic material, for example, oxide, nitride, or oxynitride, for example, silicon oxide, silicon nitride, silicon oxynitride, or a combination thereof, but is not limited thereto. The interlayer insulating layer 145 may be formed of one layer or two or more layers.

A protective layer 160 may be disposed or formed on the thin film transistor (TFT). The protective layer 160 may be, for example, a passivation layer. The protective layer 160 may include an organic material, an inorganic material, or an organic-inorganic material, for example, polyacrylic, polyimide, polyamide, poly (amide-imide), or a combination thereof, but is not limited thereto. The protective layer 160 may be formed of one layer or two or three or more layers.

In the light emitting panel according to an embodiment, the plurality of light emitting units 180a, 180b, 180c may be disposed for each of sub-pixels $PX_1$, $PX_2$, and $PX_3$, e.g., the plurality of light emitting units 180a, 180b, 180c may be disposed in each sub-pixel $PX_1$, $PX_2$, and $PX_3$, respectively. The plurality of light emitting units 180a, 180b, and 180c disposed in each sub-pixel $PX_1$, $PX_2$, and $PX_3$, respectively, may be independently driven. The light emitting units may be, for example, an inorganic light emitting element or diode (e.g., a light emitting diode including an inorganic emitter). The inorganic light emitting element may be a microsized light emitting diode (LED), inorganic nanosized light emitting diode, or a combination thereof. In an embodiment, the light emitting units 180 may be a quantum dot light emitting diode, a perovskite light emitting diode, a microsized light emitting diode, or a combination thereof.

Figure 6:
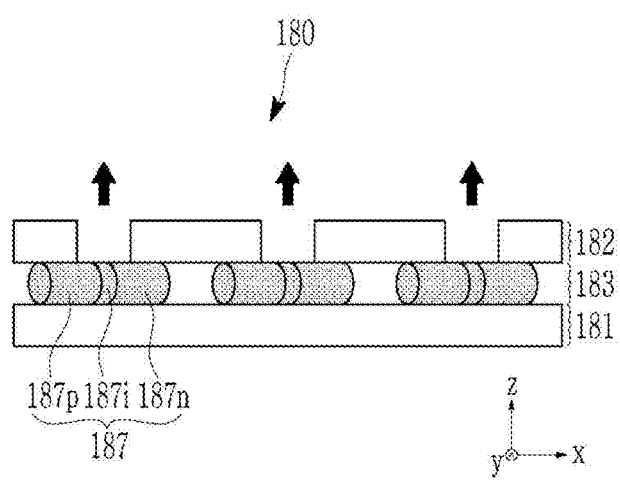
FIG. 6 is a cross-sectional view illustrating a light emitting unit in a display panel according to an embodiment.

Each of FIG. 5 and FIG. 6 is a cross-sectional view showing an embodiment of a light emitting unit, respectively.

Referring to FIG. 5, an embodiment of the light emitting unit 180 may include a first electrode 181 and a second electrode 182 facing each other; and a light emitting layer 183 between the first electrode 181 and the second electrode 182, and the light emitting layer 183 is electrically connected to the second electrode 182 and the light emitting layer 183. In an embodiment, the first electrode 181 and the second electrode 182 may face each other. In an embodiment, the light emitting layer 183 may be disposed between the first electrode 181 and the second electrode 182 (e.g., facing each other).

In an embodiment, the first electrode 181 and the second electrode 182 may face each other along a thickness direction (for example, the z direction), for example. The first electrode 181 or the second electrode 182 may be an anode and the other may be a cathode. The first electrode 181 may be a light transmitting electrode, a translucent electrode, or a reflective electrode, and the second electrode 182 may be a light transmitting electrode, a translucent electrode, or a reflective electrode. The light transmitting electrode or translucent electrode may include or may be, for example, a single layer or multiple layers of metal thin film including conductive oxides such as indium tin oxide (ITO), indium zinc oxide (IZO), zinc oxide (ZnO), tin oxide (SnO), aluminum tin oxide (AlTO), fluorine-doped tin oxide (FTO), or a combination thereof; silver (Ag), copper (Cu), aluminum (Al), magnesium (Mg), magnesium-silver (Mg—Ag), magnesium-aluminum (Mg—Al), or a combination thereof; or a combination thereof. The reflective electrode may include a metal, a metal nitride, or a combination thereof, for example, silver (Ag), copper (Cu), aluminum (Al), gold (Au), titanium (Ti), chromium (Cr), nickel (Ni), an alloy thereof, a nitride thereof (e.g., TiN), or a combination thereof, but is not limited thereto.

The light emitting layer 183 may include a light emitter (e.g., an inorganic based light emitter) emitting light of a third emission spectrum (hereinafter, a third light). The third emission spectrum may belong to a relatively short wavelength region in the visible light wavelength spectrum and for example, a blue emission spectrum.

The light emitting layer or the light emitter may include an inorganic light emitter, and the inorganic light emitter may be an inorganic semiconductor, a quantum dot, a perovskite material, or a combination thereof.

In an embodiment, the light emitting layer 183 or the inorganic light emitter may include a p-n diode layer that includes a n-doped semiconductor layer, a p-doped semiconductor layer, and an active layer (e.g., a quantum well layer) between the n-doped semiconductor layer and the p-doped semiconductor layer. In an embodiment, a front surface (or a top surface) of the p-n diode layer may correspond to the light extraction surface. The p-n diode layer may include one or more layers based on a Group II-VI material (e.g., ZnSe) or a Group III-V material. The Group III-V material may include a Group III-V nitride material (e.g., GaN, AlN, InN, InGaN, an alloy thereof, or a combination thereof), a Group III-V phosphide material (e.g., GaP, AlGaInP, an alloy thereof, or a combination thereof), or a Group III-V arsenide material (e.g., AlGaAs).

The p-n diode layer may include an indium gallium nitride (InGaN), a gallium nitride (GaN), an aluminum gallium nitride, a gallium phosphide (GaP), an aluminum gallium indium phosphide (AlGaInP), an aluminum gallium phosphide (AlGaP), a zinc selenide (ZnSe), or a combination thereof, which may be p-doped or n-doped, respectively.

In an embodiment, the p-n diode layer may be designed to emit blue light and the material may include a nitride based material. In an embodiment, the p-n diode layer may include GaN, AlGaN, InGaN, or a combination thereof.

In an embodiment, the n-doped layer may include n-GaN, n-AlGaN, n-InGaN, n-AlGaInP, or a combination thereof, and the p-doped layer may include a p-AlGaN, a p-GaN, a p-InGaN, a p-AlGaInP, or a combination thereof, but are not limited thereto. The quantum well layer may include a variety of materials. The quantum well layer may include a single quantum well layer (SQW) or a multi quantum well layer (MQW). The number of quantum well layer may be greater than or equal to 1, or greater than or equal to about 3, and less than or equal to about 10, or less than or equal to about 8. A thickness of each layer may be selected appropriately and is not particularly limited. 30

In an embodiment, the light emitting unit may further include an auxiliary layer 184 between the first electrode 181 and the light emitting layer 183, an auxiliary layer 185 between the second electrode 182 and the light emitting layer 183, or a combination thereof. The auxiliary layer may be a charge auxiliary layer to control injection, mobility, or a combination thereof of charge carriers. Each of the auxiliary layers 184 and 185 may be defined by one layer or two or more layers, and may be, for example, a hole injection layer, a hole transport layer, an electron blocking layer, an electron injection layer, an electron transport layer, a hole blocking layer, or a combination thereof. In an embodiment, one or both of the auxiliary layers 184 and 185 may be omitted.

Referring to FIG. 6, the light emitting unit 180 may include a first electrode 181, a second electrode 182, and a light emitting layer 183 including a plurality of nanostructures 187.

The first electrode 181 or the second electrode 182 may be an anode and the other may be a cathode. The first electrode 181 and the second electrode 182 may be electrodes patterned according to arrangement directions of the plurality of nanostructures 187. Details for the first electrode and the second electrodes are the same as those described herein.

The light emitting layer 183 may include a plurality of nanostructures 187, and each of the sub-pixels $PX_1$, $PX_2$, and $PX_3$ may include a plurality of nanostructures 187. The plurality of nanostructures 187 may be arranged along one direction, but the disclosure is not limited thereto. The nanostructures 187 may be a compound semiconductor to emit light of a set or predetermined wavelength spectrum when an electric current is applied, and may be, for example, linear nanostructures such as nanorods, nanoneedles, or a combination thereof. The diameter or long diameter of the nanostructures 187 may be, for example, several to several hundreds of nanometers, and aspect ratios of the nanostructures 187 may be greater than about 1, greater than or equal to about 1.5, greater than or equal to about 2.0, greater than or equal to about 3.0, greater than or equal to about 4.0, greater than or equal to about 4.5, or greater than or equal to about 5.0; in a range of about 1 to about 20, in a range of about 1.5 to about 20, in a range of about 2.0 to about 20, in a range of about 3.0 to about 20, in a range of about 4.0 to about 20, in a range of about 4.5 to about 20, in a range of about 5.0 to about 20, or a combination thereof.

Each of the nanostructures 187 may include a p-type region 187*p*, an n-type region 187*n*, and a multiple quantum well region 187*i*, and may emit light from the multiple quantum well region 187*i*. The nanostructures 187 may include, for example, gallium nitride (GaN), indium gallium nitride (InGaN), aluminum gallium nitride (AlGaN), or a combination thereof, but is not limited thereto. The nanostructures 187 may have, for example, a core-shell structure.

The plurality of nanostructures 187 may emit a third light and details of the incident light are the same as those described herein.

The first light emitting unit (or the second light emitting unit) may be configured to provide the first color conversion region (or the second color conversion region) with an incident light with an intensity (e.g., a luminance) of greater than or equal to about 10,000 candela/m$^2$ (nit) and less than or equal to about 17,000,000 candela/m$^2$ (nit).

In an embodiment, an intensity of the incident light may be greater than or equal to about 15,000 nit, greater than or equal to about 18,000 nit, greater than or equal to about 20,000 nit, greater than or equal to about 23,000 nit, greater than or equal to about 25,000 nit, greater than or equal to about 28,000 nit, greater than or equal to about 30,000 nit, greater than or equal to about 33,000 nit, greater than or equal to about 35,000 nit, greater than or equal to about 38,000 nit, greater than or equal to about 40,000 nit, greater than or equal to about 43,000 nit, greater than or equal to about 45,000 nit, greater than or equal to about 48,000 nit, greater than or equal to about 50,000 nit, greater than or equal to about 53,000 nit, greater than or equal to about 55,000 nit, greater than or equal to about 58,000 nit, greater than or equal to about 60,000 nit, greater than or equal to about 63,000 nit, or greater than or equal to about 65,000 nit.

In an embodiment, an intensity of the incident light may be less than or equal to about 17,000,000 nit, less than or equal to about 16,000,000 nit, less than or equal to about 15,000,000 nit, less than or equal to about 14,000,000 nit, less than or equal to about 13,000,000 nit, less than or equal to about 12,000,000 nit, less than or equal to about 11,000,000 nit, less than or equal to about 10,000,000 nit, less than or equal to about 9,000,000 nit, less than or equal to about 8,000,000 nit, less than or equal to about 7,000,000 nit, less than or equal to about 6,000,000 nit, less than or equal to about 5,000,000 nit, less than or equal to about 4,000,000 nit, less than or equal to about 3,000,000 nit, less than or equal to about 2,000,000 nit, less than or equal to about 1,800,000 nit, less than or equal to about 1,700,000 nit, less than or equal to about 1,600,000 nit, less than or equal to about 1,000,000 nit, less than or equal to about 900,000 nit, less than or equal to about 800,000 nit, less than or equal to about 700,000 nit, less than or equal to about 600,000 nit, less than or equal to about 500,000 nit, less than or equal to about 400,000 nit, less than or equal to about 300,000 nit, less than or equal to about 200,000 nit, less than or equal to about 100,000 nit, less than or equal to about 90,000 nit, less than or equal to about 80,000 nit, less than or equal to about 70,000 nit, less than or equal to about 60,000 nit, or less than or equal to about 50,000 nit.

In an embodiment, an intensity of the incident light may be obtained, e.g., controlled, by controlling a wavelength of the incident light and an electrical power of the light emitting unit and taking into consideration a dimension of the pattern as described herein. In an embodiment, the electrical power of the light emitting unit may be greater than or equal to about 1 microwatt (µW), greater than or equal to about 1.5 µW, greater than or equal to about 2 µW, greater than or equal to about 2.5 µW, greater than or equal to about 3 µW, greater than or equal to about 3.5 µW, greater than or equal to about 4 µW, greater than or equal to about 4.5 µW, greater than or equal to about 5 µW, greater than or equal to about 10 µW, greater than or equal to about 50 µW, greater than or equal to about 70 µW, greater than or equal to about 90 µW, or greater than or equal to about 100 µW. In an embodiment, the electrical power of the light emitting unit may be less than or equal to about 1 milliwatt (mW), less than or equal to about 900 µW, less than or equal to about 800 µW, less than or equal to about 700 µW, less than or equal to about 600 µW, less than or equal to about 500 µW, less than or equal to about 400 µW, less than or equal to about 300 µW, less than or equal to about 200 µW, less than or equal to about 100 µW, less than or equal to about 90 µW, less than or equal to about 80 µW, less than or equal to about 70 µW, less than or equal to about 60 µW, less than or equal to about 50 µW, less than or equal to about 40 µW, less than or equal to about 30 µW, less than or equal to about 20 µW, less than or equal to about 10 µW, less than or equal to about 9 µW, less than or equal to about 8 µW, less than or equal to about 7 µW, less than or equal to about 6 µW, less than or equal to about 5 µW, less than or equal to about 4 µW, or less than or equal to about 3 µW. The electrical power may be in a combined range of the limits recited herein.

A display including an individual light source of a very small size (for example, a microsized LED (micro-LED)) may contribute to providing an improvement in a brightness, an efficiency, a viewing angle, a lifetime, or the like, drawing much attention as a next generation display device. A display device adopting, e.g., including, micro-LEDs each emitting different color light (for example, emitting red light, green light, blue light, respectively) for each sub-pixel may also include a very complex driving part for the display device, for example, due to the light emitting properties of a green light emitting LED. Accordingly, it is a technological challenge to realize a high definition and large sized display device (e.g., an 8K display (e.g., a display having an image or display resolution with a width of about 8,000 pixels) with a size of 88 inches or greater) that includes an individual light source system. In addition, for such a display device, each of the individual LEDs may be disposed corresponding to each of the sub-pixels respectively, which may involve a complex process, making it difficult to reduce a production cost.

In a display device of an embodiment, the light emitting panel may include microsized LEDs each emitting incident light (e.g., blue light) for each of the pixels (or sub-pixels) as a light source and the light conversion panel may include a color conversion layer wherein first semiconductor nanoparticles capable of converting an incident light to a first light (e.g., red light) and second semiconductor nanoparticles capable of converting an incident light to a second light are disposed in a first light conversion region and a second light conversion region, respectively. In an embodiment, three blue light emitting microsized LEDs may constitute one pixel, and on each of the blue light emitting microsized LEDs, the first semiconductor nanoparticles capable of converting an incident light to a first light (e.g., red light) and second semiconductor nanoparticles capable of converting an incident light to a second light (green light) are disposed, optionally together with a light diffusing agent, in the first light conversion region and the second light conversion region to form the first light, the second light, the incident light (e.g., red-blue-green (RBG)) sub-pixels. In a display device of an embodiment, the brightness (or luminance) of the blue light emitting microsized LED may be controlled depending on the information sought to be displayed, and the brightness of the red-green-blue (R,G,B) sub-pixels may be controlled to express colors (see FIG. 1B and FIG. 4A).

In this regard, the present inventors have found that in such a display device, irradiation of a relatively high energy of light (blue light) having high light dose may be concentrated on a relatively small area of a color conversion region of the color conversion layer, not only resulting in the carbonization of the polymer of the composite but also causing a severe photo-bleaching of the semiconductor nanoparticles. The photo-bleaching may lead to a sharp decrease of the light conversion efficiency of the color conversion layer and may have a seriously adverse effect on a photo-reliability of the display device. In an embodiment, a display device (or a display apparatus including the same) may include a microsized individual light source such as a microLED together with the semiconductor nanoparticles for the down conversion of the wavelength of the light and may exhibit improved photo-stability of the color conversion panel or the color conversion layer, as well.

Surprisingly, the present inventors have found that adopting, e.g., using, the color conversion panel described herein may contribute to improving the reliability of the device.

Figure 7:
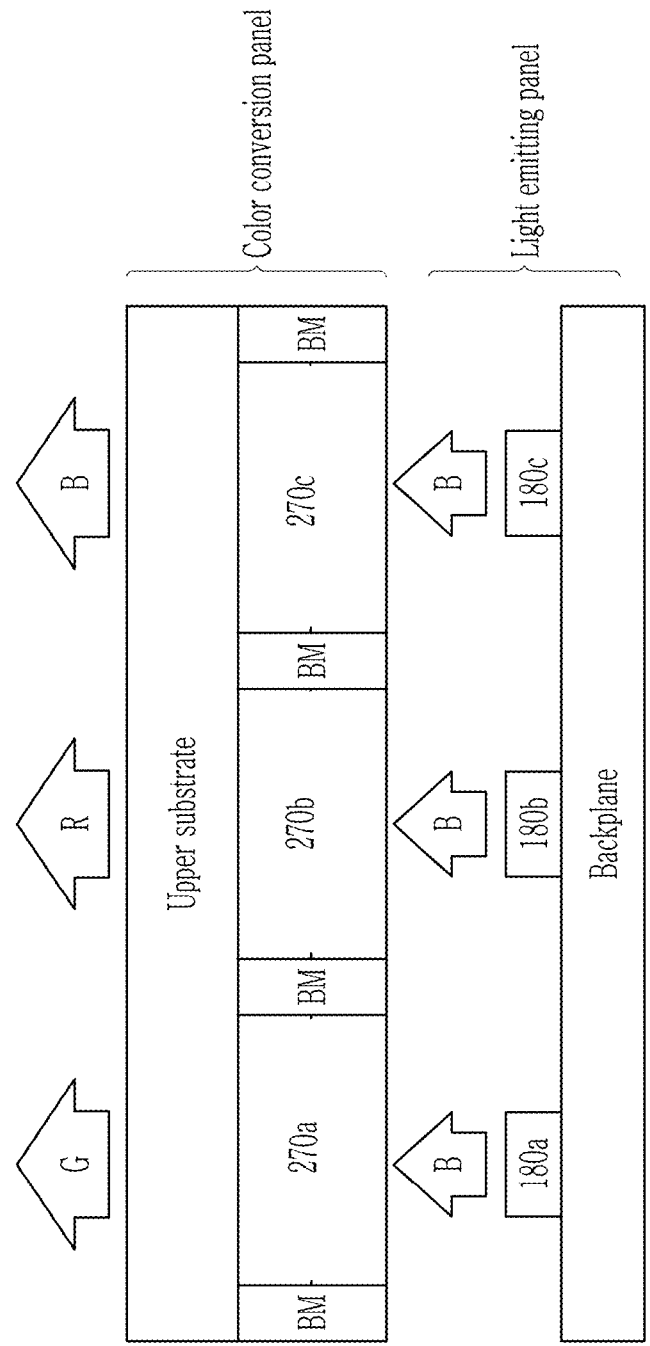
FIG. 7 is a cross-sectional view schematically illustrating a display panel according to an embodiment.

In an embodiment, referring to FIG. 4A and FIG. 7, the color conversion panel 200 may convert the incident light supplied from the light emitting panel 100 into a light of a different spectrum (e.g., a first light or a second light), and may emit the converted light toward an observer (not shown). In an embodiment, the color conversion panel 200 may include a color conversion layer 270 that includes a first color conversion region 270a and a second color conversion region 270b; and optionally a first partition wall 250 or black matrix (BM) defining the first color conversion region 270a and the second color conversion region 270b, respectively. The color conversion layer 270 may be disposed on an upper substrate 210. The substrate or the color conversion panel 200 may further include a light blocking pattern 220 corresponding to the partition wall. A color filter layer 230 or a color filter 230a, 230b, or 230c may be further provided between the color conversion layer 270 and the upper substrate 210.

The upper substrate 210 may be a substrate including an insulating material. The substrate may include glass; various polymers such as a polyester of polyethylene terephthalate (PET), polyethylene naphthalate (PEN), and the like, polycarbonate, and polyacrylate; a polysiloxane (e.g., polydimethylsiloxane (PDMS)); an inorganic material such as $Al_2O_3$ or ZnO; or a combination thereof, but is not limited thereto. A thickness of the substrate may be appropriately selected taking into consideration a substrate material but is not particularly limited. The substrate may be a flexible substrate. The substrate may have a transmittance of greater than or equal to about 50%, greater than or equal to about 60%, greater than or equal to about 70%, greater than or equal to about 80%, or greater than or equal to about 90% for light emitted from semiconductor nanoparticles that are described herein.

The color conversion layer 270 may face the light emitting unit 180 of the light emitting panel 100. The color conversion layer 270 may include a plurality of color conversion regions to convert an emission spectrum of light (e.g., a third light) supplied from the light emitting panel 100 into other emission spectrum. In an embodiment, the color conversion region may, for example, convert light in the emission spectrum supplied from the light emitting panel 100 into light in the emission spectrum of the color displayed by each of the sub-pixels $PX_1$, $PX_2$, and $PX_3$.

Referring to FIG. 4A and FIG. 7, the color conversion layer 270 may include a first color conversion region 270a included in the first sub-pixel $PX_1$ and including a first semiconductor nanoparticle, a second color conversion region 270b included in the second sub-pixel $PX_2$ and including a second semiconductor nanoparticle, and a third light transmitting or color conversion region 270c included in the third sub-pixel $PX_3$ and including or not including third semiconductor nanoparticle. Each of the color conversion regions may be defined by a partition wall.

In an embodiment, the first color conversion region 270a may include a first semiconductor nanoparticle-polymer composite that includes a first polymer matrix; and a first semiconductor nanoparticle dispersed in the first polymer matrix, wherein the first semiconductor nanoparticle-polymer matrix is configured to convert the incident light supplied from the first light emitting unit into light of a first luminescent spectrum (a first light).

In an embodiment, the second color conversion region 270b may include a second semiconductor nanoparticle-polymer composite that includes a second polymer matrix; and a second semiconductor nanoparticle dispersed in the second polymer matrix, wherein the second semiconductor nanoparticle-polymer matrix is configured to convert the incident light supplied from the second light emitting unit into a second light.

The color conversion layer may further include a third (light transmitting or color conversion) region 270c that may pass the incident light through or convert the incident light into light of a different luminescent spectrum. The third region 271c may include or may not include a third semiconductor nanoparticle. The third semiconductor nanoparticle may down-convert incident light (e.g., provided from the light emitting panel) in an ultraviolet wavelength region into a blue light (B). The third region may include a third composite including a third polymer matrix; and optionally a third semiconductor nanoparticle, a metal oxide fine particle, or a combination thereof.

The first semiconductor nanoparticle included in the first color conversion region 270a may convert the incident light emitted from the first light emitting unit into a first light of a first emission spectrum that may be the same as the wavelength spectrum of the color displayed by the first sub-pixel $PX_1$. The first emission spectrum or the first light may be different from the third emission spectrum and may have a longer wavelength spectrum than the incident light.

The second semiconductor nanoparticle included in the second color conversion area 270b may convert the incident light emitted from the second light emitting unit into a second light of a second emission spectrum that may be the same as the wavelength spectrum of the color displayed by the second sub-pixel $PX_2$. The second emission spectrum may be different from the first and third emission spectra, respectively, and the second light may be a longer wavelength spectrum than the incident light.

A luminescent peak wavelength of the first light or the second light may be present in a wavelength range of greater than or equal to 500 nm, greater than or equal to 510 nm, greater than or equal to about 520 nm, greater than or equal to about 530 nm, greater than or equal to about 540 nm, or greater than or equal to about 550 nm and less than or equal to about 580 nm, less than or equal to about 570 nm, less than or equal to about 560 nm, or less than or equal to about 550 nm, or a range derived from the stated wavelengths. The first light may be green light (G).

A luminescent peak wavelength of the second light or the first light may be present in a wavelength range of greater than or equal to about 580 nm, greater than or equal to about 590 nm, greater than or equal to about 600 nm, greater than or equal to about 610 nm, greater than or equal to about 620 nm, or greater than or equal to about 625 nm and less than or equal to about 680 nm, less than or equal to about 670 nm, less than or equal to about 650 nm, or less than or equal to about 640 nm, or a range derived from the stated wavelengths. The second light may be a red light (R).

The incident light may be blue light (B). Details of the incident light or blue light are the same as those described herein.

In an embodiment, a dimension (length or width) of the first color conversion region (e.g., a first semiconductor nanoparticle-polymer composite) L13, a dimension of the second color conversion region (e.g., a second semiconductor nanoparticle-polymer composite) L23, or a dimension of the third color conversion or light transmitting region (e.g., a third composite) L33 may be greater than or equal to about 1 μm, greater than or equal to about 3 μm, greater than or equal to about 5 μm, greater than or equal to about 7 μm, greater than or equal to about 9 μm, greater than or equal to about 11 μm, greater than or equal to about 15 μm, greater than or equal to about 20 μm, greater than or equal to about 25 μm, greater than or equal to about 30 μm, greater than or equal to about 35 μm, greater than or equal to about 40 μm, greater than or equal to about 45 μm, greater than or equal to about 50 μm, greater than or equal to about 60 μm, greater than or equal to about 70 μm, greater than or equal to about 80 μm, greater than or equal to about 90 μm, greater than or equal to about 100 μm, greater than or equal to about 130 μm, greater than or equal to about 150 μm, greater than or equal to about 170 μm, greater than or equal to about 190 μm, greater than or equal to about 200 μm, greater than or equal to about 230 μm, greater than or equal to about 250 μm, greater than or equal to about 270 μm, greater than or equal to about 290 μm, greater than or equal to about 300 μm, greater than or equal to about 330 μm, greater than or equal to about 350 μm, greater than or equal to about 370 μm, greater than or equal to about 390 μm, or greater than or equal to about 450 μm. A dimension (length or width) of the first color conversion region L13, a dimension of the second color conversion region L23, or a dimension of the third color conversion or light transmitting region L33 may be less than or equal to about 700 μm, less than or equal to about 600 μm, less than or equal to about 650 μm, less than or equal to about 550 μm, less than or equal to about 500 μm, less than or equal to about 450 μm, less than or equal to about 400 μm, less than or equal to about 350 μm, less than or equal to about 300 μm, less than or equal to about 250 μm, less than or equal to about 200 μm, less than or equal to about 180 μm, less than or equal to about 150 μm, less than or equal to about 130 μm, less than or equal to about 100 μm, less than or equal to about 90 μm, less than or equal to about 80 μm, less than or equal to about 70 μm, less than or equal to about 60 μm, less than or equal to about 50 μm, or less than or equal to about 40 μm.

In an embodiment, for example, as determined in a cross-section of a display device, a ratio of a dimension of the first color conversion region (or the first nanoparticle-polymer composite) to a dimension of the first light emitting unit (L13: L11), a ratio of a length of the second color conversion region (or the second nanoparticle-polymer composite) to a length of the second light emitting unit (L23: L21), or a ratio of a length of the third region (or the third composite) to a length of the incident light emitting unit (L33: L31) may be greater than about 1:1 and less than or equal to about 10:1, for example, in a range of about 1.5:1 to about 9.5:1, in a range of about 2:1 to about 9:1, in a range of about 2.5:1 to about 8.5:1, in a range of about 3:1 to about 8:1, in a range of about 3.5:1 to about 7.5:1, in a range of about 4:1 to about 7:1, in a range of 4.5:1 to about 6.5:1, in a range of about 5:1 to about 6:1, or a combination thereof.

In an embodiment, a ratio of a light entering area of a color conversion region (e.g., a composite) to a light extraction area of a light emitting unit may be greater than about 1:1 to about 150:1, about 3:1 to about 120:1, about 5:1 to about 110:1, about 9:1 to about 101:1, about 15:1 to about 82:1, about 24:1 to about 65:1, about 30:1 to about 55:1, about 45:1 to about 50:1, or a combination thereof.

In an embodiment, for example, as determined in a cross-section of a display device, a thickness of the first color conversion region (or a composite included therein), a thickness of the second color conversion region (or a composite included therein), or a thickness of the third color conversion region (or a composite included therein), H13, H23, H33 is not particularly limited and may be selected appropriately. In an embodiment, for example as determined in a cross-section of a display device, a thickness of the first color conversion region H13, a thickness of the second color conversion region H23, or a thickness of the third color conversion region H33 may be each independently greater than or equal to about 1 μm, greater than or equal to about 3 μm, greater than or equal to about 5 μm, greater than or equal to about 7 μm, greater than or equal to about 9 μm, greater than or equal to about 11 μm, greater than or equal to about 13 μm, greater than or equal to about 15 μm, greater than or equal to about 17 μm, or greater than or equal to about 19 μm. The thickness of the color conversion region (e.g., the first color conversion region H13, a thickness of the second color conversion region H23, or a thickness of the third color conversion region H33) may be less than or equal to about 30 μm, less than or equal to about 25 μm, or less than or equal to about 20 μm.

In each of the color conversion regions, the first semiconductor nanoparticle, the second semiconductor nanoparticle, and optionally the third semiconductor nanoparticle (for example, in an embodiment in which the third semiconductor nanoparticle is present) may convert an emission spectrum of incident light supplied from the light emitting panel 100 into light of an emission spectrum different from the emission spectrum of incident light. In an embodiment, the first semiconductor nanoparticle and the second semiconductor nanoparticle may convert the incident light into the first light and the second light. In an embodiment, the third semiconductor nanoparticle may convert an incident light (for example, belonging to an ultraviolet wavelength region) into blue light.

In an embodiment, the semiconductor nanoparticle may include a semiconductor nanocrystal, capable of exhibiting a quantum confinement effect. The semiconductor nanoparticle such as a quantum dot may absorb light from an excitation source and may emit light corresponding to a bandgap energy thereof. The bandgap energy of the semiconductor nanoparticle may vary with the size of the nanoparticle, the composition of the nanoparticle, or a combination thereof. A toxic heavy metal such as cadmium may pose somewhat serious concerns, for example, may pose an environmental issue, a health issue, or a combination thereof, and may be listed as a restricted element under Restriction of Hazardous Substances Directive (RoHS) in many countries. In an embodiment, the semiconductor nanoparticle may not include cadmium (Cd), lead (Pb), mercury (Hg), or a combination thereof.

The semiconductor nanoparticle (i.e., the first semiconductor nanoparticle, the second semiconductor nanoparticle, the third semiconductor nanoparticle, or a combination thereof) may have a core-shell structure having a (semiconductor nanocrystal) core and a (semiconductor nanocrystal) shell disposed on the core. In an embodiment, the semiconductor nanoparticle, the semiconductor nanocrystal core, the semiconductor nanocrystal shell, or a combination thereof may include a Group II-VI compound, a Group III-V compound, a Group IV-VI compound, a Group IV element or compound, a Group I-III-VI compound, a Group I-II-IV-VI compound, or a combination thereof. In an embodiment, the quantum dots may not include cadmium, lead, mercury, or a combination thereof.

In an embodiment, the Group II-VI compound may be a binary element compound such as CdSe, CdTe, ZnS, ZnSe, ZnTe, ZnO, HgS, HgSe, HgTe, MgSe, MgS, or a combination thereof; a ternary element compound such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, or a combination thereof; a quaternary element compound such as HgZnTeS, CdZnSeS, CdZnSeTe, CdZnSTe, CdHgSeS, CdHgSeTe, CdHgSTe, HgZnSeS, HgZnSeTe, HgZnSTe, or a combination thereof; or a combination thereof. The Group III-V compound may be a binary element compound such as GaN, GaP, GaAs, GaSb, AlN, AlP, AlAs, AlSb, InN, InP, InAs, InSb, or a combination thereof; a ternary element compound such as GaNP, GaNAs, GaNSb, GaPAs, GaPSb, AlNP, AlNAs, AlNSb, AlPAs, AlPSb, InNP, InNAs, InNSb, InPAs, InPSb, or a combination thereof; a quaternary element compound such as GaInNSb, GaInPAs, GaInPSb, InAlNP, InAlNAs, InAlNSb, InAlPAs, InAlPSb, or a combination thereof; or a combination thereof. The Group IV-VI compound may be a binary element compound such as SnS, SnSe, SnTe, PbS, PbSe, PbTe, or a combination thereof; a ternary element compound such as SnSeS, SnSeTe, SnSTe, PbSeS, PbSeTe, PbSTe, SnPbS, SnPbSe, SnPbTe, or a combination thereof; a quaternary element compound such as SnPbSSe, SnPbSeTe, SnPbSTe, or a combination thereof; or a combination thereof. In an embodiment, the Group I-III-VI compound may include $CuInSe_2$, $CuInS_2$, CuInGaSe, and CuInGaS, but are not limited thereto. In an embodiment, the Group I-II-IV-VI compound may include CuZnSnSe, and CuZnSnS, but are not limited thereto. The Group IV element or compound may be a single substance such as Si, Ge, or a combination thereof; a binary element compound such as SiC, SiGe, or a combination thereof; or a combination thereof. The Group III-V compound may further include a Group II metal (e.g., InZnP, etc.).

In an embodiment, the binary element compound, the ternary element compound or the quaternary element compound respectively exist in a uniform concentration in the particle or partially different concentrations in the same particle. In an embodiment, the semiconductor nanoparticle has a core-shell structure, and the semiconductor nanocrystal of the shell may have a larger bandgap energy than the semiconductor nanocrystal of the core. In an embodiment, the semiconductor nanoparticle has a core-shell structure, and the semiconductor nanocrystal of the shell may have a smaller bandgap energy than the semiconductor nanocrystal of the core. In an embodiment, the shell may be a multi-layered shell, and an outer shell layer may have a larger bandgap energy than an inner shell close to the core, but is not limited thereto. In a core-shell semiconductor nanoparticle including a multi-layered shell, an outer shell layer may have a smaller bandgap energy than a shell close to the core.

In an embodiment, the semiconductor nanoparticles may include a indium phosphide based compound as a light emission center (e.g., a core). The semiconductor nanoparticles may include a zinc chalcogenide-based shell (e.g., including zinc; and selenium, sulfur, or a combination thereof) disposed on the". The shell may be a multi-layered shell. The shell may include a first shell layer including a zinc selenide and a second shell layer including a zinc sulfide.

The semiconductor nanoparticle (e.g., the first semiconductor nanoparticle, the second semiconductor nanoparticle, or the third semiconductor nanoparticle) may have a size of about 1 nm to about 100 nm. In an embodiment, the semiconductor nanoparticle may have a size (or an average size) of greater than or equal to about 2 nm, greater than or equal to about 2.5 nm, greater than or equal to about 3 nm, greater than or equal to about 3.5 nm, greater than or equal to about 4 nm, greater than or equal to about 4.5 nm, greater than or equal to about 5 nm, greater than or equal to about 5.5 nm, greater than or equal to about 6 nm, greater than or equal to about 6.5 nm, greater than or equal to about 7 nm, greater than or equal to about 7.5 nm, greater than or equal to about 8 nm, greater than or equal to about 8.5 nm, greater than or equal to about 9 nm, greater than or equal to about 9.5 nm, or greater than or equal to about 10 nm.

In an embodiment, the semiconductor nanoparticle may have a size (or an average size) of less than or equal to about 50 nm, less than or equal to about 45 nm, less than or equal to about 40 nm, less than or equal to about 35 nm, less than or equal to about 30 nm, less than or equal to about 25 nm, less than or equal to about 24 nm, less than or equal to about 23 nm, less than or equal to about 22 nm, less than or equal to about 21 nm, less than or equal to about 20 nm, less than or equal to about 19 nm, less than or equal to about 18 nm, less than or equal to about 17 nm, less than or equal to about 16 nm, less than or equal to about 15 nm, less than or equal to about 14 nm, less than or equal to about 13 nm, less than or equal to about 12 nm, less than or equal to about 11 nm, less than or equal to about 10 nm, less than or equal to about 9 nm, less than or equal to about 8 nm, less than or equal to about 7 nm, less than or equal to about 6.5 nm, less than or equal to about 6 nm, less than or equal to about 5.5 nm, or less than or equal to about 5 nm. In an embodiment, the size of the semiconductor nanoparticle may refer to a diameter or an equivalent diameter obtained, e.g., determined, from a two-dimensional image of an electron microscopy analysis (e.g., under an assumption of a circle). In an embodiment, "a size" may refer to a size of a single semiconductor nanoparticle or a (e.g., a mean or a median) average of semiconductor nanoparticles or a population of the semiconductor nanoparticles. A size of the semiconductor nanoparticle may be determined by using a result (e.g., an image) of a (transmission) electron microscopy analysis and any suitable image analysis computer program (e.g., Image J).

In an embodiment, the semiconductor nanoparticle may have any suitable shape which is not particularly limited. In an embodiment, the semiconductor nanoparticles may include spherical, pyramidal, multi-arm, or cubic nanoparticles, nanotubes, nanowires, nanofibers, nanosheets, or a combination thereof. The semiconductor nanoparticle may be commercially available or may be synthesized according to any suitable method. In an embodiment, several nano-sized semiconductor nanoparticles may be synthesized according to a wet chemical process, for example. In an embodiment, the semiconductor nanoparticle may include an organic such as an organic solvent or an organic ligand (e.g., bound) on a surface thereof. In an embodiment, the organic ligand having the hydrophobic moiety may include $RCOOH$, $RNH_2$, $R_2NH$, $R_3N$, $RSH$, $R_3PO$, $R_3P$, $ROH$, $RCOOR'$, $RPO(OH)_2$, $R_2POOH$, wherein R and R' are each independently a substituted or unsubstituted C1 to C40 (or C3 to C24) aliphatic hydrocarbon group, for example, a substituted or unsubstituted alkyl, a substituted or unsubstituted alkenyl, or a substituted or unsubstituted C3 to C40 (or C6 to C20) aromatic hydrocarbon group, for example, an aryl group, or a combination thereof.

The semiconductor nanoparticle (or the semiconductor nanoparticle-polymer composite described herein) may exhibit a quantum efficiency or a quantum yield of greater than or equal to about 40%, greater than or equal to about 45%, greater than or equal to about 50%, greater than or equal to about 55%, greater than or equal to about 60%, greater than or equal to about 65%, greater than or equal to about 70%, greater than or equal to about 75%, greater than or equal to about 80%, greater than or equal to about 85%, greater than or equal to about 90%, greater than or equal to about 95%, or greater than or equal to about 100%. The quantum efficiency or the quantum yield may be measured by using a suitable equipment (e.g., QE-2100 manufactured by Otsuka electronics Co. Ltd.) for a semiconductor nanoparticle dispersion or a semiconductor nanoparticle composite, but is not limited thereto.

The semiconductor nanoparticle (or the semiconductor nanoparticle-polymer composite described herein) may exhibit a full width at half maximum of less than or equal to about 50 nm, less than or equal to about 45 nm, less than or equal to about 41 nm, less than or equal to about 40 nm, less than or equal to about 39 nm, less than or equal to about 38 nm, less than or equal to about 37 nm, less than or equal to about 36 nm, less than or equal to about 35 nm, less than or equal to about 34 nm, less than or equal to about 33 nm, less than or equal to about 32 nm, less than or equal to about 31 nm, less than or equal to about 30 nm, less than or equal to about 29 nm, less than or equal to about 28 nm, less than or equal to about 27 nm, less than or equal to about 26 nm, or less than or equal to about 25 nm. The full width at half maximum may be greater than or equal to about 10 nm, greater than or equal to about 15 nm, or greater than or equal to about 20 nm.

As used herein, the quantum efficiency may be a relative quantum yield or an absolute quantum yield that can be readily measured by any suitable equipment. The quantum efficiency (or quantum yield) may be measured in a solution state or a solid state (as in a composite). In an embodiment, "quantum yield (or quantum efficiency)" may be a ratio of photons emitted to photons absorbed by the quantum dot composite, e.g., by a nanostructure or population of nanostructures. In an embodiment, the quantum efficiency may be determined by any suitable method. For example, quantum efficiency may be measured by an absolute method and a relative method.

The absolute method directly obtains, e.g., determines, the quantum yield by detecting all sample fluorescence through the use of an integrating sphere. In the relative method, the fluorescence intensity of a standard sample (e.g., a standard dye) may be compared with the fluorescence intensity of an unknown sample to calculate the quantum yield of the unknown sample. Coumarin 153, Coumarin 545, Rhodamine 101 inner salt, Anthracene, and Rhodamine 6G may be used as standard dye, depending on the photoluminescent wavelengths, but are not limited thereto. The quantum yield (QY) may be readily and reproducibly determined by using commercially available equipment, for example, from Hitachi Co. Ltd or Hamamatsu Co. Ltd and referring to the instruction manuals provided from the manufacturer. The FWHM and the maximum PL peak wavelength may be determined by a photoluminescent spectrum obtained by a spectrophotometer (or Fluorescence Spectrophotometer).

In an embodiment, in the color conversion region (e.g., the first, second, or third color conversion region) or in the (first, second, or third) semiconductor nanoparticle-polymer composite, an amount of the (first, second, or third) semiconductor nanoparticle may be, based on a total weight of a composite disposed in the color conversion region, greater than or equal to about 1 wt %, greater than or equal to about 2 wt %, greater than or equal to about 3 wt %, greater than or equal to about 4 wt %, greater than or equal to about 5 wt %, greater than or equal to about 6 wt %, greater than or equal to about 7 wt %, greater than or equal to about 8 wt %, greater than or equal to about 9 wt %, greater than or equal to about 10 wt %, greater than or equal to about 15 wt %, greater than or equal to about 20 wt %, greater than or equal to about 25 wt %, greater than or equal to about 30 wt %, greater than or equal to about 35 wt %, greater than or equal to about 40 wt %, or greater than or equal to about 45 wt %. The amount of the (first, second, or third) semiconductor nanoparticles may be, based on a total weight of the composite disposed in the color conversion region, less than or equal to about 70 wt %, less than or equal to about 65 wt %, less than or equal to about 60 wt %, less than or equal to about 55 wt %, or less than or equal to about 50 wt %. The total weight of the composite may substantially correspond to a total solid content of an ink composition described herein.

In the first color conversion region or the first semiconductor nanoparticle-polymer composite, the first polymer matrix may include a polymer including a unit (e.g., a repeating unit) with a COO⁻ moiety and the first semiconductor nanoparticle-polymer composite may further include an additional metal substance distributed in the first polymer matrix. The additional metal substance may include a Group IIB metal, a Group IIIA metal, or a combination thereof.

Surprisingly, the present inventors have found that in the case of a composite wherein the additional metal substance and the semiconductor nanoparticles distributed in the matrix including the polymer, the efficiency of the semiconductor nanoparticle may be maintained even when light of a relatively high luminance is irradiated for example from a microsized LED or the like. Without wishing to be bound by any theory, it is believed that the combination of the additional metal substance and the polymer may provide an additional cross-linking or an additional passivation, and even when the semiconductor nanoparticles or the composite is exposed to a high luminance incident light (e.g., an incident light having a far higher luminance than the light passing through a liquid crystal layer or the light from the organic light emitting diode), photo-oxidation or photo-bleaching may be suppressed and carbonization of the polymer may be prevented, and an initial quantum efficiency of the composite may be effectively maintained. The photostability of the composite may contribute to securing reliability of the display panel.

In the composite of an embodiment, the additional metal substance may be distributed in the matrix (e.g., outside the semiconductor nanoparticles), relatively uniformly. In an embodiment, the first semiconductor nanoparticle-polymer composite may exhibit the presence of the additional metal substance at a position not overlapping the semiconductor nanoparticle as determined by a suitable analysis tool (e.g., a scanning electron microscopy-energy dispersive spectroscopy analysis).

In the composite of an embodiment, the polymer including the unit (e.g., the repeating unit) of a COO moiety, specifically a COO⁻ moiety, may include a unit (or a repeating unit) represented by Chemical Formula 1:

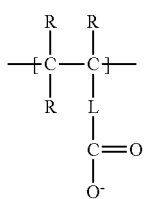

Chemical Formula 1

In the composite of an embodiment, the polymer including the unit (e.g., the repeating unit) of a COO moiety may further include a unit (or a repeating unit) including a COO moiety in particular a COOH moiety represented by Chemical Formula 2:

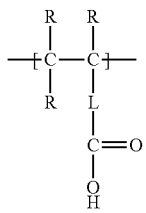

Chemical Formula 2

In the Chemical Formulae 1 and 2, R is the same or different and each R is independently hydrogen, a carboxyl group, an amine group, a hydroxyl group, a substituted or unsubstituted C1 to C10 hydrocarbon group (for example, a substituted or unsubstituted C1 to C10 alkyl group), or a combination thereof, L is a direct bond, a substituted or unsubstituted C1 to C50 alkylene group; a substituted or unsubstituted C2 to C50 alkenylene group; a sulfonyl group (—S(=O)₂—), a carbonyl group (—C(=O)—), an ether group (—O—), a sulfide group (—S—), a sulfoxide group (—S(=O)—), an ester group (—C(=O)O— wherein the oxygen is linked to a backbone carbon atom), an amide group (—C(=O)NR'—) (wherein R' is hydrogen or a C1 to C10 alkyl group), or a combination thereof.

The polymer may include an anionic carboxylate group, COO⁻, that may be formed by a reaction between a polymer with a carboxyl group, a compound including an additional metal described herein, and the semiconductor nanoparticle.

The polymer may include a copolymer further including a repeating unit that does not include a COO moiety. In an embodiment, the copolymer may further include a substituted or unsubstituted alkylene unit, for example an ethylene or propylene repeating unit. The copolymer may include a random copolymer, a block copolymer, an alternating copolymer, or a combination thereof. The polymer may be a copolymer of an alkylene such as ethylene and a (meth) acrylic, e.g., a (meth)acrylic acid compound, or a copolymer of an alkylene such as ethylene, a (meth)acrylic, e.g., a (meth)acrylic acid compound, and a (meth)acrylate compound, or a combination thereof. The polymer may include poly (ethylene-co-acrylic acid), poly (ethylene-co-methacrylic acid), poly (propylene-co-acrylic acid), poly (propylene-co-methacrylic acid), poly (butylene-co-acrylic acid), poly (butylene-co-methacrylic acid), or a combination thereof.

The polymer may be a linear polymer. The polymer may include or may not include a repeating unit having, e.g., including, an aromatic moiety.

The polymer, in particular a copolymer containing a carboxylic acid group (which may or may not convert to an anion in use) may be represented by Chemical Formula 3:

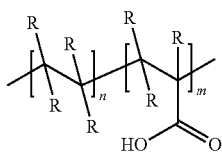

Chemical Formula 3

In the Chemical Formula 3, R may be, each independently, hydrogen, a C1 to C10 alkyl group, a carboxyl group, an amine group, a hydroxyl group, or a combination thereof, n and m represent a mole ratio between the repeating units, and n:m may be about 1:0.01 to about 1:100, about 1:0.01 to about 1:90, about 1:0.05 to about 1:80, about 1:0.1 to about 1:70, about 1:0.3 to about 1:60, about 1:0.5 to about 1:50, about 1:1 to about 1:45, about 1:2 to about 1:40, or a combination thereof.

In the copolymer of Chemical Formula 3, an amount of the repeating unit having the carboxyl group or the carboxylate group (i.e., an anionic form of the carboxyl group) may be from about 1 wt % to about 50 wt %, about 2 wt % to about 40 wt %, about 3 wt % to about 30 wt %, about 4 wt % to about 20 wt %, about 5 wt % to about 15 wt %, about 6 wt % to about 12 wt %, about 7 wt % to about 10 wt %, about 8 wt % to about 9 wt %, or a combination thereof. The polymer may have a melting point of from about 30 to about 140° C., about 40 to about 130° C., about 50 to about 120° C., about 60 to about 110° C., about 70 to about 105° C., about 80 to about 100° C., or a combination thereof, for example, as measured by differential scanning calorimetry (DSC).

Figure 8A:
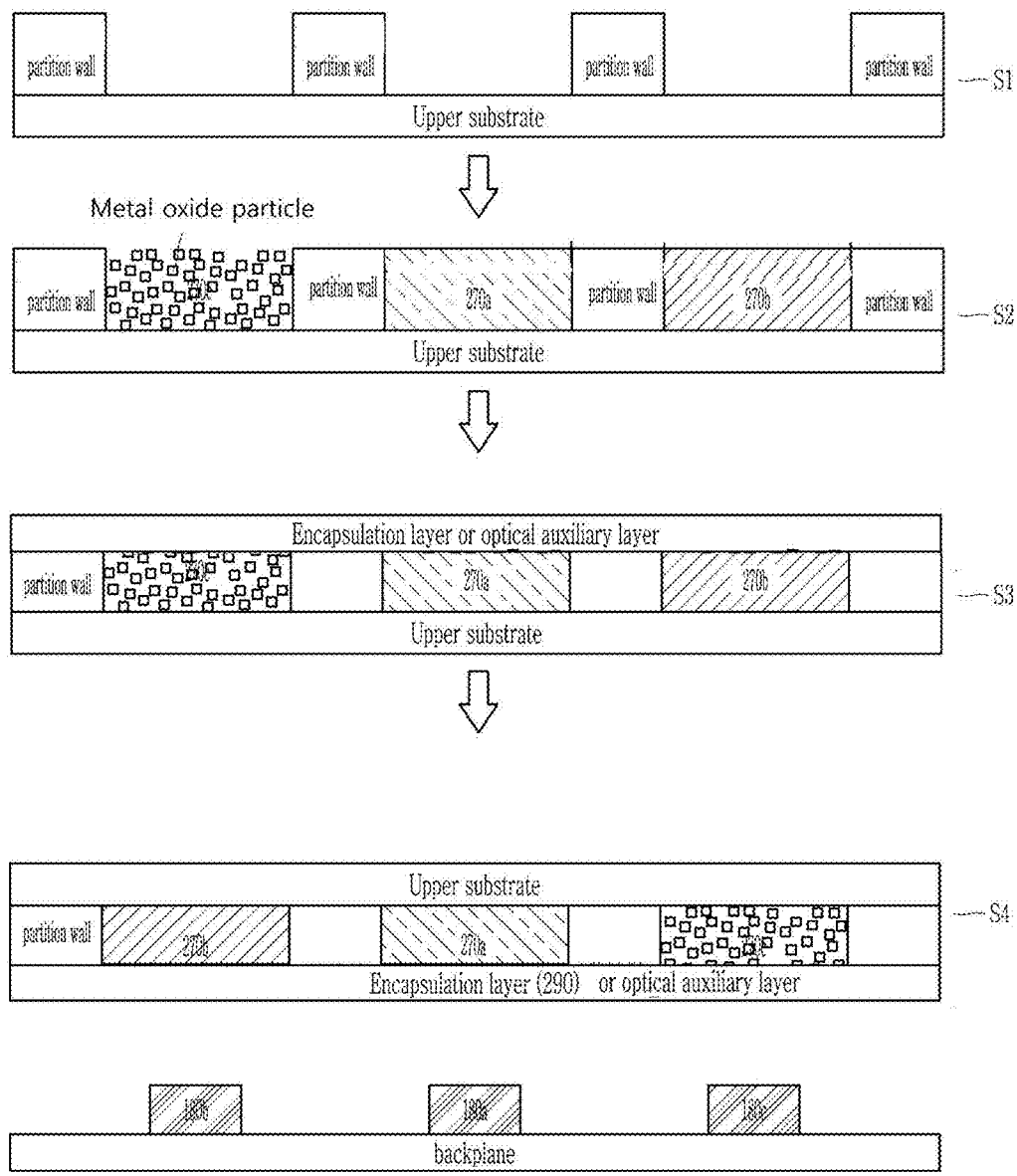
FIG. 8A schematically shows a production process of a display panel of FIG. 7 according to an embodiment.
Figure 8B:
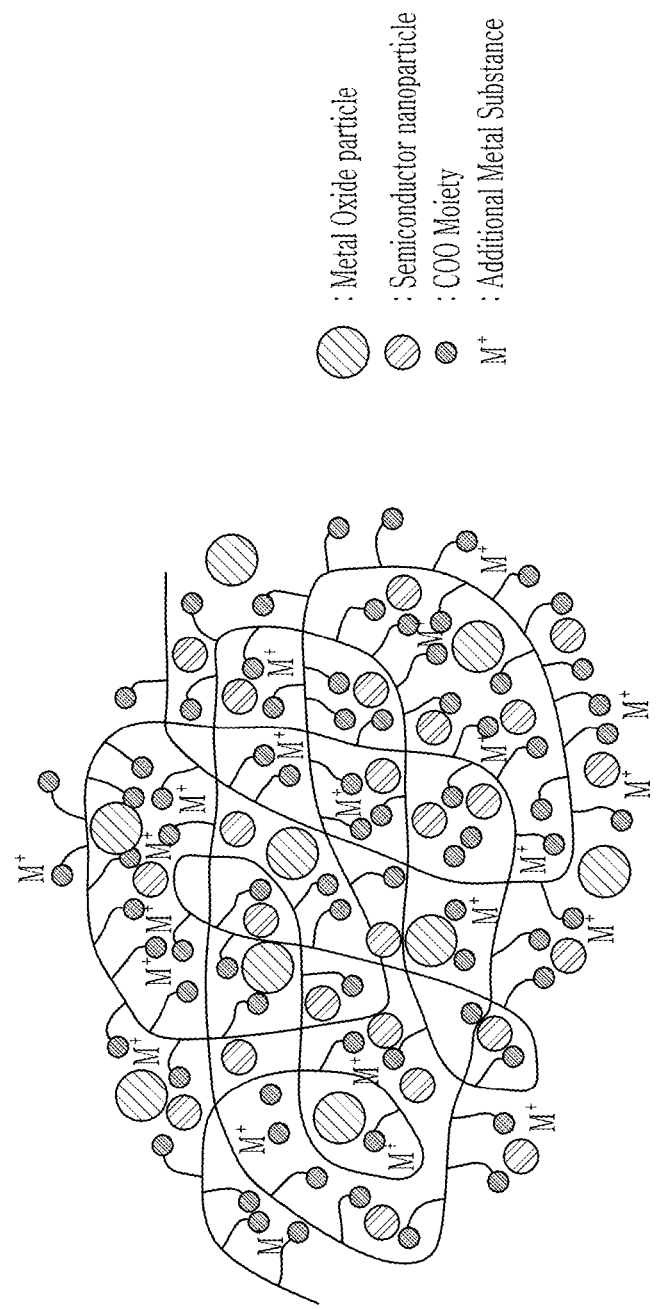
FIG. 8B is a schematic view of semiconductor nanoparticles and additional metal substance in a semiconductor nanoparticle-polymer composite (e.g., a first semiconductor nanoparticle-polymer composite) of an embodiment.

Without wishing to be bound by any theory, it is believed that the COO moiety, for example the COO⁻ moiety of the polymer and the additional metal substance may interact for example with the semiconductor nanoparticles, and in the composite (for example, without an additional crosslinked polymer) a desired level of a crosslinking property may be obtained. In an embodiment, the polymer, the additional metal substance, and the semiconductor nanoparticles may react each other to form an aggregate. Without wishing to be bound by any theory, it is believed that a multidentate type of the additional metal substance (for example, a metal salt, M+, polyvalent, divalent, trivalent or the like), a carboxy group of the polymer or a moiety derived therefrom (COOH or COO⁻), and the semiconductor nanoparticle (e.g., quantum dot) (e.g., a surface thereof) may react each other to form an aggregate. (See FIG. 8B).

The additional metal substance may include a Group IIB metal such as zinc, cadmium, or mercury, a Group III metal such as aluminum, gallium, indium, thallium, or a combination thereof, or a combination thereof. In an embodiment, the composite may include a toxic heavy metal such as cadmium, mercury, or the like.

The additional metal substance may include an aluminum halide such as an aluminum fluoride, an aluminum chloride, an aluminum bromide, or an aluminum iodide, a hydrocarbyl aluminum with a C1 to C10 (e.g., C1 to C5) hydrocarbon group (for example, an alkylated aluminum such as trimethyl aluminum, triethyl aluminum, or methyl diethyl aluminum), a zinc halide such as a zinc chloride, a zinc bromide, a zinc fluoride, or a zinc iodide, a hydrocarbyl zinc with a C1 to C10 (e.g., C1 to C5) hydrocarbon group (for example, an alkylated zinc such as diethyl zinc), or a combination thereof. The additional metal substance may be present, in the composite, as a metal cation form derived from the compound described herein.

In an embodiment, a composition including the polymer, the additional metal substance, and the semiconductor nanoparticle may exhibit a controlled flow-ability (for example, a flow temperature). The flow temperature may be determined by placing the composition in a glass container, turning the glass container upside down, and measuring a temperature at which at least 90%, greater than or equal to about 95%, a greater than or equal to about 99% of the composition move in a direction of gravity.

The composition may exhibit a flow temperature of greater than or equal to about 85° C., greater than or equal to about 87° C., greater than or equal to about 89° C., greater than or equal to about 90° C., greater than or equal to about 95° C., greater than or equal to about 100° C., greater than or equal to about 105° C., greater than or equal to about 110° C., or greater than or equal to about 115° C. The flow temperature of the composition may be from about 85° C. to about 200° C., about 87° C. to about 180° C., about 90° C. to about 170° C., about 95° C. to about 165° C., about 100° C. to about 155° C., about 110° C. to about 145° C., about 115° C. to about 140° C., about 120° C. to about 130° C., or a combination thereof.

The flow temperature of the composition may be higher than the flow temperature of the polymer by at least about 10° C., at least about 20° C., at least about 30° C., at least about 40° C., or at least about 50° C.

In the first semiconductor nanoparticle-polymer composite or the second semiconductor nanoparticle-polymer composite, an amount of the additional metal substance may be, based on a total weight of the first (or the second) semiconductor nanoparticle, greater than or equal to about 0.01 wt %, greater than or equal to about 0.05 wt %, greater than or equal to about 0.1 wt %, greater than or equal to about 0.5 wt %, greater than or equal to about 1 wt %, greater than or equal to about 2 wt %, greater than or equal to about 3 wt %, greater than or equal to about 4 wt %, greater than or equal to about 5 wt %, greater than or equal to about 6 wt %, greater than or equal to about 7 wt %, greater than or equal to about 8 wt %, greater than or equal to about 9 wt %, greater than or equal to about 10 wt %, greater than or equal to about 11 wt %, greater than or equal to about 12 wt %, greater than or equal to about 13 wt %, greater than or equal to about 14 wt %, or greater than or equal to about 15 wt %, and less than or equal to about 30 wt %, less than or equal to about 29 wt %, less than or equal to about 28 wt %, less than or equal to about 27 wt %, less than or equal to about 26 wt %, less than or equal to about 25 wt %, less than or equal to about 24 wt %, less than or equal to about 23 wt %, less than or equal to about 22 wt %, less than or equal to about 21 wt %, less than or equal to about 20 wt %, less than or equal to about 19 wt %, less than or equal to about 18 wt %, less than or equal to about 17 wt %, less than or equal to about 16 wt %, less than or equal to about 15 wt %, less than or equal to about 14 wt %, less than or equal to about 13 wt %, less than or equal to about 12 wt %, less than or equal to about 11 wt %, less than or equal to about 10 wt %, less than or equal to about 9 wt %, less than or equal to about 8 wt %, less than or equal to about 7 wt %, less than or equal to about 6 wt %, or less than or equal to about 5 wt %.

In an embodiment, the first semiconductor nanoparticle may include indium and phosphorus and the additional metal substance may include aluminum.

In the first semiconductor nanoparticle-polymer composite, a mole ratio of aluminum to indium may be greater than or equal to about 0.5:1, greater than or equal to about 1:1, greater than or equal to about 3:1, greater than or equal to about 5:1, greater than or equal to about 7:1, greater than or equal to about 9:1, greater than or equal to about 11:1, greater than or equal to about 13:1, or greater than or equal to about 15:1. The mole ratio of aluminum to indium may be 50:1, less than or equal to about 45:1, less than or equal to about 30:1, less than or equal to about 27:1, less than or equal to about 25:1, less than or equal to about 20:1, less than or equal to about 19:1, or less than or equal to about 15:1.

In an embodiment, the first semiconductor nanoparticle may include a zinc chalcogenide and the additional metal substance may include zinc.

In the first semiconductor nanoparticle-polymer composite, a mole ratio of zinc to a total sum of the chalcogen element (e.g., sulfur, selenium, tellurium, or a combination thereof) may be greater than or equal to about 1.3:1, greater than or equal to about 1.5:1, greater than or equal to about 1.7:1, greater than or equal to about 1.9:1 greater than or equal to about 2:1, greater than or equal to about 2.3:1, greater than or equal to about 2.5:1, greater than or equal to about 2.7:1, greater than or equal to about 2.9:1, greater than or equal to about 3:1, greater than or equal to about 3.1:1, greater than or equal to about 3.3:1, greater than or equal to about 3.5:1, greater than or equal to about 3.7:1, or greater than or equal to about 3.9:1 and less than or equal to about 5:1, less than or equal to about 4:1, less than or equal to about 3.5:1, or less than or equal to about 2:1.

In the composite or the aggregate described herein, an amount of a given element may be determined by using a suitable analysis tool. The analysis tool may include an inductively coupled plasma atomic emission spectroscopy analysis (ICP-AES), an x-ray photoelectron spectroscopy analysis (XPS), or a (transmission or scanning) electron microscopy-energy dispersive spectroscopy analysis (TEM EDX or SEM EDX), but is not limited thereto.

In an embodiment, the polymer matrix may further include a crosslinked polymer. The cross-linked polymer may include a cross-linked thiolene polymer, a cross-linked poly(meth)acrylate, a crosslinked polyurethane, a cross-linked epoxy polymer or resin, a crosslinked vinyl polymer, a crosslinked silicone polymer or resin, or a combination thereof. The polymer may include an acryl polymer (e.g., a poly(meth)acrylate, an acryl resin), an urethan polymer or resin, a silicone polymer or resin, an epoxy polymer or resin, a cardo polymer or resin, an imide polymer or resin, a derivative thereof, or a combination thereof, but is not limited thereto. The polymer matrix may include a crosslinked polymer, a linear polymer, or a combination thereof. The linear polymer may include a repeating unit derived from a carbon-carbon double bond to provide a polyalkylene unit. The repeating unit may include a carboxyl group, e.g., a carboxylic acid group. The linear polymer may include an ethylene repeating unit.

The polymer matrix may further include or may not include a binder polymer soluble to an alkaline (aqueous) solution for securing a pattern forming property of an ink composition described herein.

The carboxyl group containing linear polymer or the binder polymer may act as a dispersant for the semiconductor nanoparticles.

The crosslinked polymer may include a polymerization product (an insulating polymer) of a polymerizable monomer including a, e.g., at least one (e.g., at least two, three, four, or five or more), carbon-carbon double bond; and optionally a polymerization product of the polymerizable monomer and a polythiol compound having, e.g., including, at least two thiol groups for example at the terminal ends of the multi-thiol compound; or a combination thereof.

The first matrix, the second matrix, the third matrix, or a combination thereof may include a light transmitting polymer (e.g., an insulating polymer).

In an embodiment, in the second color conversion region or the second semiconductor nanoparticle-polymer composite, the second polymer matrix may include a polymer including a unit (e.g., a repeating unit) with a COO$^-$ moiety and the second semiconductor nanoparticle-polymer composite may further include an additional metal substance distributed in the second polymer matrix. The additional metal substance may include a Group IIB metal, a Group IIIA metal, or a combination thereof.

Details of the first polymer matrix and the additional metal substance may be applied to the second polymer matrix and the additional metal substance included therein.

In an embodiment, the first color conversion region or the first semiconductor nanoparticle-polymer composite may further include optionally a metal oxide particle. If present the metal oxide particle may be dispersed in the first matrix. In an embodiment, the second color conversion region or the second semiconductor nanoparticle-polymer composite may further include optionally a metal oxide particle. The second semiconductor nanoparticles and if present the metal oxide particle may be dispersed in the second matrix.

In an embodiment, the third color conversion or light transmitting region may further include a third matrix and optionally a metal oxide particle. The third color conversion or light transmitting region may include or may not include semiconductor nanoparticle configured to convert the incident light into a light of a different color (e.g., the third semiconductor nanoparticles such as blue light emitting quantum dots). In the third region, the semiconductor nanoparticles, the metal oxide particle, or a combination 10) thereof may be dispersed in the third matrix The metal oxide particle may include $TiO_2$, $SiO_2$, $BaTiO_3$, $Ba_2TiO_4$, ZnO, or a combination thereof. The metal oxide fine particle may be non-emissive. As used herein, the wording "metal oxide" may include an oxide of a metal or a metalloid. The metal oxide particle may have an appropriately selected diameter without a particular limit. The (average) diameter of the metal oxide particle may be greater than or equal to about 100 nm, for example, greater than or equal to about 150 nm, or greater than or equal to about 200 nm and less than or equal to about 1,000 nm or less than or equal to about 800 nm.

In an embodiment, the metal oxide particle may scatter light emitted from the semiconductor nanoparticles, reflect light emitted from the semiconductor nanoparticles, or a combination thereof, and lead, e.g., direct, the light emitted from the semiconductor nanoparticles to an upper substrate (or, for example, a color filter layer 230a, 230b, 230c shown in FIG. 4C). In an embodiment, for example, in a blue pixel or subpixel, the metal oxide particle may scatter the light emitting unit 180 of the light emitting panel 100, reflect the light emitting unit 180 of the light emitting panel 100, or a combination thereof, and lead, e.g., direct, the light emitted from light emitting unit 180 to an upper substrate.

In an embodiment, in the color conversion region (e.g., the first, second, or third color conversion region), an amount of the metal oxide particle may be, based on a total weight of the composite disposed in the color conversion region, greater than or equal to about 0.1 wt %, greater than or equal to about 0.5 wt %, greater than or equal to about 1 wt %, greater than or equal to about 1.5 wt %, greater than or equal to about 2 wt %, greater than or equal to about 2.5 wt %, greater than or equal to about 3 wt %, greater than or equal to about 3.5 wt %, greater than or equal to about 4 wt %, greater than or equal to about 4.5 wt %, greater than or equal to about 5 wt %, or greater than or equal to about 10 wt %. The amount of the metal oxide particle may be less than or equal to about 50 wt %, less than or equal to about 40 wt %, less than or equal to about 30 wt %, less than or equal to about 25 wt %, less than or equal to about 20 wt %, less than or equal to about 15 wt %, less than or equal to about 10 wt %, or less than or equal to about 5 wt %.

A partition wall 250 (or black matrix, BM) may define each region (270a, 270b, 270c) of the color conversion layer 270 and be between adjacent regions. In an embodiment, the partition wall may be disposed between adjacent color conversion regions. In an embodiment, the partition wall 250 may respectively define the aforementioned first and second color conversion regions 270a and 270b and the third color conversion/light transmitting region 270c and may be disposed between the adjacent first and second color conversion regions 270a and 270b, between the second color conversion region 270b and the light transmitting region 270c which may be neighboring each other (e.g., adjacent to each other, or next to each other), and may be between the first color conversion region 270a and the light transmitting region 270c, which may be neighboring (e.g., adjacent to, or next to) each other in an embodiment (or would otherwise be neighboring, adjacent to, or next to each other in an embodiment in which the second color conversion region 270b was omitted).

The partition wall 250 or the black matrix (BM) may include a material that can prevent or block light in a given (color conversion) region from progressing, e.g., travelling, into another region. In an embodiment, the partition wall may include a material that can absorb or reflect (at least a portion of) light. In an embodiment, the partition wall or the black matrix (BM) may include a light blocking or shield member. In an embodiment, the partition wall 250 or the black matrix (BM) may include a material that can block, for example, absorb or reflect light. The material may include a dye, a pigment, a light reflective mat, a light absorbing material, or a combination thereof. The material is not particularly limited as long as the material can block at least a portion of a predetermined light. The material may include a material usable for a bank in a light emitting diode (e.g., an organic light emitting diode (OLED)). In an embodiment, the pigment may be a white pigment, a black pigment, a grey pigment, or a combination thereof, but is not limited thereto.

In an embodiment, the partition wall 250 or the black matrix (BM) may be prepared from a photoresist composition including a pigment (e.g., a photoresist composition for preparing a black matrix, a grey matrix, or a white matrix). The photoresist composition including the pigment may be commercially available or be known in the art.

In an embodiment, referring to FIG. 4C, the color filter layer 230 including a color filter 230a, 230b, 230c may be provided, for example, between the upper substrate 210 and the color conversion layer 270. The color filter layer 230 may be positioned in a direction in which some light passing through the color conversion layer 270 may be emitted. The color filter layer 230 may include color filters 230a, 230b, and 230c in each sub-pixel $PX_1$, $PX_2$, and $PX_3$ and selectively transmit light of different wavelength spectra. The color filters 230a, 230b, and 230c may each selectively transmit light of a same wavelength spectrum as the color displayed in each sub-pixel $PX_1$, $PX_2$, and $PX_3$ and also, selectively transmit light of the emission spectrum converted in each region of the color conversion layer 270.

In an embodiment, for example, the first sub-pixel $PX_1$, the second sub-pixel $PX_2$, and the third sub-pixel $PX_3$ respectively may display green, red, and blue. In an embodiment, in which light of each green emission spectrum, red emission spectrum, and blue emission spectrum may be emitted from the first color conversion region 270a, the second color conversion region 270b, and the light transmitting region 270c, respectively, the first color filter 230a overlapping the first color conversion region 270a may be a green filter, the second color filter 230b overlapping the second color conversion region 270b may be a red filter, and the third color filter 230c overlapping the light transmitting region 270c may be a blue filter. The first color filter 230a, the second color filter 230b, or the third color filter 230c may include a pigment, a dye, or a combination thereof to selectively transmit light of a green wavelength spectrum, a red wavelength spectrum, or a blue wavelength spectrum but absorb light of the other wavelength spectra, reflect light of the other wavelength spectra, or a combination thereof.

In an embodiment, a light blocking pattern 220 may be provided between the color filter and the upper substrate. The light blocking pattern 220 may define each sub-pixel $PX_1$, $PX_2$, and $PX_3$ and be between the neighboring sub-pixels $PX_1$, $PX_2$, and $PX_3$. The light blocking pattern 220 may be, for example, a black matrix. The light blocking pattern 220 may overlap the edges of the neighboring color filters 230a, 230b, and 230c.

In an embodiment, a color conversion panel may further include a planarization layer 240, for example, disposed between the color filter layer 230 and the color conversion layer 270. The planarization layer 240 may reduce or eliminate a step difference caused by the color filter layer 230. The planarization layer 240 may include an organic material, an inorganic material, an organic-inorganic material, or a combination thereof. The planarization layer 240 may include, for example, an oxide, a nitride, an oxynitride, or a combination thereof, for example, silicon oxide, silicon nitride, silicon oxynitride, or a combination thereof, but is not limited thereto. The planarization layer 240 may be one layer or two or more layers, and may cover an entire surface of the upper substrate 210.

In an embodiment, the color conversion panel may further include an encapsulation layer 290. The encapsulation layer 290 may cover the color conversion layer 270 and the partition wall 250.

The encapsulation layer 290 may include a glass plate, a metal thin film, an organic film, an inorganic film, an organic-inorganic film, or a combination thereof. The organic film may include, for example, an acrylic resin, a (meth)acrylic resin, polyisoprene, a vinyl resin, an epoxy resin, a urethane resin, a cellulose resin, a perylene resin, or a combination thereof, but is not limited thereto. The inorganic film may include, for example, an oxide, a nitride, an oxynitride, or a combination thereof, for example silicon oxide, silicon nitride, silicon oxynitride, aluminum oxide, aluminum nitride, aluminum oxynitride, zirconium oxide, zirconium nitride, zirconium oxynitride, titanium oxide, titanium nitride, titanium oxynitride, hafnium oxide, hafnium nitride, hafnium oxynitride, tantalum oxide, tantalum nitride, tantalum oxynitride, lithium fluoride, or a combination thereof, but is not limited thereto. The organic-inorganic film may include, for example, polyorganosiloxane, but is not limited thereto. The encapsulation layer 290 may be one layer, or two, or more layers.

In the color conversion panel or the display panel according to an embodiment, an aperture ratio (%) may be in a range of about 1% to about 100%, about 2% to about 95%, about 3 to about 90%, about 4% to about 85%, about 5% to about 80%, about 6% to about 75%, about 7 to about 70%, about 8% to about 65%, about 9% to about 60%, about 10% to about 55%, about 11% to about 50%, about 12% to about 45%, about 13% to about 40%, about 14% to about 35%, about 15% to about 30%, about 16 to % about 25%, about 17% to about 20%, or a combination thereof. In the color conversion panel or the display panel of an embodiment, an aperture ratio may be less than or equal to about 15%, less than or equal to about 14%, less than or equal to about 13%, less than or equal to about 12%, less than or equal to about 11%, less than or equal to about 10%, less than or equal to about 9%, less than or equal to about 8%, or less than or equal to about 7%.

In an embodiment, the display panel may be prepared by a process including: providing the color conversion panel on the light emitting panel, wherein the color conversion panel may be prepared by depositing a first ink composition and a second ink composition on a first color conversion region and a second color conversion region on a substrate or a base structure optionally having a partition wall defining the first color conversion region and the second color conversion region to form a first semiconductor nanoparticle-polymer composite and a second semiconductor nanoparticle-polymer composite (hereinafter, the formation of the composite pattern).

The first ink composition includes the first semiconductor nanoparticles, a polymer (e.g., a linear polymer) having a (repeating) unit with, e.g., including, a $COO^-$ moiety, and additional metal substance. The additional metal substance may include a Group IIB metal, a Group IIIA metal, or a combination thereof.

In an embodiment, the first ink composition may further include a polymerizable monomer capable of providing a cross-linked polymer or a combination thereof, a compound having a COO moiety, e.g., a COOH moiety and soluble in an aqueous alkaline solution (e.g., a binder polymer), an initiator, an organic solvent, a metal oxide particle, or a combination thereof.

In an embodiment, providing the light emitting panel may vary with a type of the light emitting panel to be provided (e.g., QNED or micro-LED), and may be prepared in any suitable method.

The formation of the composite pattern may be conducted in a suitable manner.

In an embodiment, the formation of the composite pattern may be conducted in an ink-jet printing manner. In an inkjet printing manner, a substrate or a base structure optionally having a partition wall defining the first color conversion region and the second color conversion region may be provided (S1) and an ink composition may be deposited in each of the color conversion regions, respectively (S2), and a polymerization may be carried out for the composition. An encapsulation layer or optical auxiliary layer may be provided opposite an upper substrate (S3). The composite pattern may be inverted (S4). (See FIG. 8A).

In an embodiment, the formation of the composite pattern may include a photolithography process using a photosensitive composition including semiconductor nanoparticles. In the photolithography process, the photosensitive composition may be applied (or coated) on a substrate to form a film, which is then optionally prebaked, exposed to light under a mask having a pattern, developed with a developing liquid (e.g., an alkaline aqueous solution), and optionally post-baked to form a semiconductor nanoparticle-polymer composite pattern, but the process is not limited thereto.

In an embodiment, the providing of the color conversion panel may involve an electrohydrodynamic (EHD) patterning. In the EHD patterning, a relatively strong electric filed may be applied between a nozzle and a lower electrode to form a fine liquid drop, which may be applied for patterning a composition including semiconductor nanoparticles.

In an embodiment, preparing the first ink composition may include forming an aggregate including the first semiconductor nanoparticles, a (linear) polymer including a repeating unit with a COO⁻ moiety, and an additional metal substance and mixing the formed aggregate with other components for the ink composition.

In an embodiment, the ink composition may be prepared by mixing the prepared aggregate with an organic solvent, optionally a binder compound; an initiator, a polymerizable monomer (e.g., (meth)acrylate monomer), optionally a thiol compound, and optionally, a metal oxide particle, and optionally, an additive described herein. The components may be mixed in any suitable order or simultaneously, and the order of the mixing is not particularly limited.

The formation of the aggregate may include mixing the polymer including the repeating unit with the COO⁻ moiety (e.g., —COOH), the semiconductor nanoparticles, and for example a compound for the additional metal substance in an organic solvent and conducting a reaction therebetween at an elevated temperature for a predetermined time.

A weight ratio of the semiconductor nanoparticle to the polymer (semiconductor nanoparticle: polymer, wt: wt) may be from about 0.1:51 to about 51:0.1, from about 0.5:50 to about 50:0.5, from about 1:49 to about 49:1, 2:46 to about 46:2, from about 3:42 to about 42:1, from about 4:41 to about 41:4, from about 5:40 to about 40:5, from about 6:38 to about 38:6, from about 7:35 to about 35:7, from about 8:33 to about 33:8, from about 9:28 to about 28:9, from about 10:25 to about 25:10, from about 11:20 to about 20:11, from about 12:15 to about 15:12, from about 13:14 to about 14:13, about 12:12, or a combination thereof.

An amount of the additional metal substance (in the composite or being used for the formation of the aggregate) may be, per 100 parts by weight of polymer, greater than or equal to about 0.01 parts by weight, greater than or equal to about 0.05 parts by weight, greater than or equal to about 0.1 parts by weight, greater than or equal to about 0.5 parts by weight, greater than or equal to about 1 parts by weight, greater than or equal to about 1.5 parts by weight, greater than or equal to about 2 parts by weight, greater than or equal to about 2.5 parts by weight, greater than or equal to about 3 parts by weight, greater than or equal to about 3.5 parts by weight, greater than or equal to about 4 parts by weight, greater than or equal to about 4.5 parts by weight, greater than or equal to about 5 parts by weight, greater than or equal to about 5.5 parts by weight, greater than or equal to about 6 parts by weight, greater than or equal to about 6.5 parts by weight, greater than or equal to about 7 parts by weight, greater than or equal to about 7.5 parts by weight, greater than or equal to about 8 parts by weight, greater than or equal to about 8.5 parts by weight, greater than or equal to about 9 parts by weight, greater than or equal to about 9.5 parts by weight, or greater than or equal to about 10 parts by weight. The amount of the additional metal substance may be, per 100 parts by weight of the polymer, less than or equal to about 90 parts by weight, less than or equal to about 80 parts by weight, less than or equal to about 70 parts by weight, less than or equal to about 60 parts by weight, less than or equal to about 50 parts by weight, less than or equal to about 40 parts by weight, less than or equal to about 30 parts by weight, less than or equal to about 25 parts by weight, or less than or equal to about 20 parts by weight.

In the ink composition or the aggregate, an amount of the additional metal substances may be, based on a total weight of the semiconductor nanoparticle, greater than or equal to about 0.01 wt %, greater than or equal to about 0.05 wt %, or greater than or equal to about 0.1 wt % and less than or equal to about 30 wt %, less than or equal to about 20 wt %, or less than or equal to about 10 wt %.

The organic solvent may be selected taking into consideration the polymer, the semiconductor nanoparticle, and the additional metal substance. The organic solvent may include a substituted or unsubstituted aromatic solvent such as toluene, an amine solvent such as trioctyl amine, a substituted or unsubstituted aliphatic solvent such as 1-octadecene, or the like.

The reaction temperature or the reaction time are not particularly limited and selected appropriately.

The reaction time may be from about 40° C. to about 150° C., from about 50° C. to about 140° C., from about 70° C. to about 130° C., from about 105° C. to about 125° C., or a combination thereof. The reaction time may be from about 10 minutes to about 2 hours or from about 30 minutes to about 1 hour, or a combination thereof.

The aggregate may be recovered by filtration or a removal of the solvent and may be washed with an organic solvent (e.g., an alkane solvent)

In the first ink composition, an amount of the semiconductor nanoparticle may be the same as described herein for the semiconductor nanoparticle in the composite, and in an embodiment, the amount of semiconductor nanoparticle may be, based on a total solid content of the ink composition, greater than or equal to about 1 wt %, greater than or equal to about 10 wt %, greater than or equal to about 20 wt %, or greater than or equal to about 25 wt %. The amount of the first semiconductor nanoparticle may be, based on a total solid content of the ink composition, less than or equal to about 50 wt %, or less than or equal to about 40 wt %.

If present, in the first ink composition, an amount of the metal oxide particle may be the same as described herein for the metal oxide particle in the composite. In an embodiment, the amount of the metal oxide particle may be greater than or equal to about 0.01 wt % and less than or equal to about 20 wt %, based on a total solid content of the ink composition.

In the first ink composition, an amount of the additional metal substance (e.g., in a form of a compound) may be, based on a total weight of the first semiconductor nanoparticle, greater than or equal to about 0.001 wt %, greater than or equal to about 0.005 wt %, greater than or equal to about 0.01 wt %, greater than or equal to about 0.05 wt %, greater than or equal to about 0.1 wt %, greater than or equal to about 0.5 wt %, greater than or equal to about 1 wt %, greater than or equal to about 3 wt %, greater than or equal to about 5 wt %, greater than or equal to about 7 wt %, or greater than or equal to about 9 wt %. In the first ink composition, an amount of the additional metal substance (e.g., in a form of a compound) may be, based on a total weight of the first semiconductor nanoparticle, less than or equal to about 20 wt %, less than or equal to about 15 wt %, less than or equal to about 10 wt %, less than or equal to about 7 wt %, or less than or equal to about 5 wt %.

The first ink composition may exhibit a flow temperature described herein.

In an embodiment, the second ink composition includes the second semiconductor nanoparticle, and optionally further include a polymer (e.g., a linear polymer) having a (repeating) unit with a COO⁻ moiety, and additional metal substance. The additional metal substance may include a Group IIB metal, a Group IIIA metal, or a combination thereof. In an embodiment, the second ink composition may further include a polymerizable monomer capable of providing a cross-linked polymer or a combination thereof, a compound having a COOH moiety and soluble in an aqueous alkaline solution (e.g., a binder polymer), an initiator, an organic solvent, a metal oxide particle, or a combination thereof.

Details described herein for the first ink composition may be applied for the second ink composition.

The first ink composition or the second ink composition may further include various components, depending on the pattern forming method.

In an embodiment, a polymerizable monomer (or a combination thereof) capable of providing a cross-linked polymer may include a polymerizable (e.g., photopolymerizable) monomer including a carbon-carbon double bond; and optionally a thiol compound (e.g., a monothiol or a polythiol compound).

In an embodiment, examples of the polymerizable monomer may include an acryl based monomer. The polymerizable monomer may include, but are not limited to, alkyl (meth)acrylate, ethylene glycol di(meth)acrylate, triethylene glycol di(meth)acrylate, diethylene glycol di(meth)acrylate, 1,4-butanediol di(meth)acrylate, 1,6-hexanediol di(meth)acrylate, neopentyl glycol di(meth)acrylate, pentaerythritol di(meth)acrylate, pentaerythritol tri(meth)acrylate, pentaerythritol tetra(meth)acrylate, dipentaerythritol di(meth)acrylate, dipentaerythritol tri(meth)acrylate, dipentaerythritol penta(meth)acrylate, dipentaerythritol hexa (meth)acrylate, bisphenol A epoxy(meth)acrylate, bisphenol A di(meth)acrylate, trimethylolpropane tri(meth)acrylate, ethylene glycol monomethyl ether (meth)acrylate, novolac epoxy (meth)acrylate, propylene glycol di(meth)acrylate, tris(meth)acryloyloxyethyl phosphate, tricyclodecane dimethanol diacrylate (A-DCP), 1,3,5-triallyl-1,3,5triazine-2,4,6 (1H,3H,5H)trion, or a combination thereof.

The polythiol compound may include a dithiol compound, a trithiol compound, a tetrathiol compound, or a combination thereof. For example, the polythiol compound may include glycol di-3-mercaptopropionate (e.g., ethylene glycol di-3-mercaptopropionate), glycol dimercaptoacetate (e.g., ethylene glycol dimercaptoacetate), trimethylolpropane tris(3-mercaptopropionate), pentaerythritol tetrakis(3-mercaptopropionate), pentaerythritol tetrakis(2-mercaptoacetate), 1,6-hexanedithiol, 1,3-propanedithiol, 1,2-ethanedithiol, polyethylene glycol dithiol including 1 to 10 ethylene glycol repeating units, or a combination thereof.

An amount of the polymerizable monomer may be, based on a total weight or a total solid content of the composition, greater than or equal to about 0.05 wt %, greater than or equal to about 0.5 wt %, greater than or equal to about 1 wt %, greater than or equal to about 2 wt %, greater than or equal to about 10 wt %, greater than or equal to about 15 wt %, or greater than or equal to about 20 wt %. An amount of the polymerizable monomer may be, based on a total weight or a total solid content of the composition, less than or equal to about 60 wt %, less than or equal to about 40 wt %, less than or equal to about 20 wt %, less than or equal to about 19 wt %, less than or equal to about 18 wt %, less than or equal to about 17 wt %, less than or equal to about 16 wt %, less than or equal to about 15 wt %, less than or equal to about 14 wt %, less than or equal to about 13 wt %, less than or equal to about 12 wt %, less than or equal to about 11 wt %, or less than or equal to about 10 wt %.

An amount of the thiol compound may be, based on a total weight or a total solid content of the composition, less than or equal to about 50 wt %, less than or equal to about 40 wt %, less than or equal to about 30 wt %, less than or equal to about 20 wt %, less than or equal to about 10 wt %, less than or equal to about 5 wt %, less than or equal to about 4 wt %, less than or equal to about 3 wt %, less than or equal to about 2 wt %, less than or equal to about 1 wt %, or less than or equal to about 0.5 wt %. The amount of the thiol compound may be, based on a total weight or a total solid content of the composition, greater than or equal to about 0.1 wt %, greater than or equal to about 0.5 wt %, greater than or equal to about 1 wt %, greater than or equal to about 5 wt %, greater than or equal to about 10 wt %, greater than or equal to about 15 wt %, greater than or equal to about 20 wt %, or greater than or equal to about 25 wt %.

In an embodiment, the composition may further include a binder compound (e.g., a binder polymer). The binder may include a (polymeric) compound having a COOH group, which is soluble to an alkali aqueous solution. The binder may be a developing process using an alkaline aqueous solution during a photoresist process. The binder may act for dispersing the semiconductor nanoparticle in the (ink) composition.

The binder may include a monomer combination including a first monomer, a second monomer, and optionally a third monomer, the first monomer including a carboxy group, e.g., a carboxylic acid group, and a carbon-carbon double bond, the second monomer including a carbon-carbon double bond and a hydrophobic moiety and not including a carboxy or carboxylic acid group, and the third monomer including a carbon-carbon double bond and a hydrophilic moiety and not including a carboxy or carboxylic acid group or a copolymer of the monomer combination;
  a multi-aromatic ring-containing polymer including a carboxy group, e.g., a carboxylic acid group, and including a backbone structure in a main chain, wherein the backbone structure includes a cyclic group including a quaternary carbon atom and two aromatic rings bound to the quaternary carbon atom (e.g., a cardo binder); or
  a combination thereof.

The binder compound may have an acid value of greater than or equal to about 50 milligrams of potassium hydroxide (KOH) per gram (mg KOH/g). For example, the binder may have an acid value of greater than or equal to about 60 mg KOH/g, greater than or equal to about 70 mg KOH/g, greater than or equal to about 80 mg KOH/g, greater than or equal to about 90 mg KOH/g, greater than or equal to about 100 mg KOH/g, greater than or equal to about 110 mg KOH/g, greater than or equal to about 120 mg KOH/g, greater than or equal to about 125 mg KOH/g, or greater than or equal to about 130 mg KOH/g, but is not limited thereto. The binder compound may have an acid value of less than or equal to about 250 mg KOH/g, for example, less than or equal to about 240 mg KOH/g, less than or equal to about 230 mg KOH/g, less than or equal to about 220 mg KOH/g, less than or equal to about 210 mg KOH/g, less than or equal to about 200 mg KOH/g, less than or equal to about 190 mg KOH/g, less than or equal to about 180 mg KOH/g, or less than or equal to about 160 mg KOH/g, but is not limited thereto. The binder compound may have a molecular weight of greater than or equal to about 1,000 grams per mole (g/mol), for example, greater than or equal to about 2,000 g/mol, greater than or equal to about 3,000 g/mol, or greater than or equal to about 5,000 g/mol. The binder compound may have a molecular weight of less than or equal to about 100,000 g/mol, for example, less than or equal to about 50,000 g/mol.

In the composition, if present, an amount of the binder compound may be greater than or equal to about 0.5 wt %, for example, greater than or equal to about 1 wt %, greater than or equal to about 5 wt %, greater than or equal to about 10 wt %, greater than or equal to about 15 wt %, or greater than or equal to about 20 wt %, based on a total weight of the composition (or a total solid content of the composition). In an embodiment, an amount of the carboxy group, e.g., a carboxylic acid group-containing binder, may less than or equal to about 55 wt %, less than or equal to about 40 wt %, less than or equal to about 35 wt %, less than or equal to about 33 wt %, or less than or equal to about 30 wt %, based on the total weight of the composition (or a total solid content of the composition).

The initiator in the composition may be used for polymerization of the monomers. The initiator is a compound accelerating a radical reaction (e.g., radical polymerization of monomer) by producing radical chemical species under a mild condition (e.g., by heat or light). The initiator may be a thermal initiator or a photoinitiator.

The thermal initiator may include azobisisobutyronitrile, benzoyl peroxide, and the like, but is not limited thereto. The initiator may be a photoinitiator. The photoinitiator may include a triazine-based compound, an acetophenone compound, a benzophenone compound, a thioxanthone compound, a benzoin compound, an oxime ester compound, an aminoketone compound, a phosphine or phosphine oxide compound, a carbazole-based compound, a diketone compound, a sulfonium borate-based compound, a diazo-based compound, a biimidazole-based compound, or a combination thereof, but is not limited thereto. The initiator may include Irgacure 754, Hydroxycyclohexyl phenyl ketone (Irgacure 184, CAS 947-19-3), 2,4,6-Trimethylbenzoyl diphenylphosphine oxide (Irgacure TPO, CAS 75980-60-8), oxyphenyl-acetic acid2[2-oxo-2-phenyl-acetoxy-ethoxy]-ethyl ester, or a combination thereof.

In the composition, an amount of the initiator may be adjusted in light of the types and the amount of the photopolymerizable monomer as used and a total solid content of the composition.

In an embodiment, the amount of the initiator may be greater than or equal to about 0.01 wt %, or greater than or equal to about 1 wt % and less than or equal to about 10 wt %, less than or equal to about 9 wt %, less than or equal to about 8 wt %, less than or equal to about 7 wt %, less than or equal to about 6 wt %, or less than or equal to about 5 wt %, based on a total weight or a total solid content of the composition, but is not limited thereto.

In an embodiment, the composition may be a solvent less composition. In an embodiment, the composition may further include an organic solvent. Types of the organic solvent are not particularly limited. Types and amounts of the organic solvent may be appropriately selected taking into consideration the aforementioned main components (i.e., the semiconductor nanoparticle, the binder or the dispersing agent, the polymerizable monomer, the initiator, and if used, the thiol compound), and types and amounts of additives which will be described herein. The composition may include a solvent in a residual amount except for a desired amount of the solid content (non-volatile components).

Examples of the solvent and the liquid vehicle may include, but are not limited to: ethyl 3-ethoxy propionate; an ethylene glycol series such as ethylene glycol, diethylene glycol, or polyethylene glycol; a glycol ether such as ethylene glycol monomethyl ether, ethylene glycol monoethyl ether, diethylene glycol monomethyl ether, ethylene glycol diethyl ether, and diethylene glycol dimethyl ether; glycol ether acetates such as ethylene glycol monomethyl ether acetate, ethylene glycol monoethyl ether acetate, diethylene glycol monoethyl ether acetate, and diethylene glycol monobutyl ether acetate; a propylene glycol such as propylene glycol; a propylene glycol ether such as propylene glycol monomethyl ether, propylene glycol monoethyl ether, propylene glycol monopropyl ether, propylene glycol monobutyl ether, propylene glycol dimethyl ether, dipropylene glycol dimethyl ether, propylene glycol diethyl ether, and dipropylene glycol diethyl ether; a propylene glycol ether acetate such as propylene glycol monomethyl ether acetate and dipropylene glycol monoethyl ether acetate; an amide such as N-methylpyrrolidone, dimethyl formamide, and dimethyl acetamide; a ketone such as methyl ethyl ketone (MEK), methyl isobutyl ketone (MIBK), and cyclohexanone; a petroleum product such as toluene, xylene, and solvent naphtha; an ester such as ethyl acetate, propyl acetate, butyl acetate, cyclohexyl acetate, and ethyl lactate; an ether such as diethyl ether, dipropyl ether, and dibutyl ether; chloroform, a C1 to C40 aliphatic hydrocarbon (e.g., alkane, alkene, or alkyne), a halogen (e.g., chloro) substituted C1 to C40 aliphatic hydrocarbon (e.g., dichloroethane, trichloromethane, and the like), a C6 to C40 aromatic hydrocarbon (e.g., toluene, xylene, and the like), a halogen (e.g., chloro) substituted C6 to C40 aromatic hydrocarbon, or a combination thereof.

In the composition, an amount of the solvent may be greater than or equal to about 50 wt %, greater than or equal to about 55 wt %, greater than or equal to about 60 wt %, greater than or equal to about 65 wt %, greater than or equal to about 70 wt %, greater than or equal to about 75 wt %, greater than or equal to about 80 wt %, greater than or equal to about 81 wt %, greater than or equal to about 83 wt %, greater than or equal to about 84 wt %, greater than or equal to about 85 wt %, greater than or equal to about 86 wt %, or greater than or equal to about 87 wt %, based on a total weight of the composition. In the composition, an amount of the solvent may be less than or equal to about 99 wt %, less than or equal to about 95 wt %, less than or equal to about 90 wt %, or less than or equal to about 87 wt %, based on a total weight of the composition.

If desired, the composition may further include various additives such as a light diffusing agent, a leveling agent, or a coupling agent in addition to the aforementioned components. The amount of the additive is not particularly limited, and may be controlled within an appropriate range wherein the additive may not cause an adverse effect on preparation of the composition and production of the semiconductor nanoparticle-polymer composite and optionally a patterning of the composite.

If present, the additives may be used in an amount of greater than or equal to about 0.1 wt %, for example, greater than or equal to about 0.5 wt %, greater than or equal to about 1 wt %, greater than or equal to about 2 wt %, or greater than or equal to about 5 wt %, based on a total weight of the composition, but is not limited thereto. If used, the content of the additives may be less than or equal to about 20 wt %, for example, less than or equal to about 19 wt %, less than or equal to about 18 wt %, less than or equal to about 17 wt %, less than or equal to about 16 wt %, or less than or equal to about 15 wt %, based on a total weight of the composition, but is not limited thereto.

The ink composition may provide a composite for example, via, a polymerization (e.g., a radical polymerization).

An embodiment of the display panel described herein may be included in various electronic devices (for example, a display device such as television (TV), a monitor, a computer, a tablet PC, a mobile device, or the like or a lighting device). In an embodiment, an electronic device includes the display panel. The electronic device may include a portable terminal device, a monitor, a notebook PC, a television, an electronic display, a camera, an electronic part for an automobile, or a combination thereof.

Hereinafter, the embodiments will be described in greater detail with reference to examples. However, they are merely examples of embodiments of the disclosure, and the disclosure is not limited thereto.

EXAMPLES

Synthesis Example

Indium acetate, zinc acetate, and palmitic acid are dissolved in 1-octadecene in a 200 milliliter (mL) reaction flask and heated at 120° C. under vacuum. After 1 hour, a nitrogen atmosphere is added to the reaction flask and the temperature of the reaction flask is increased to 280° C. A mixed solution of tris (trimethylsilyl) phosphine ((TMS)$_3$P) and trioctyl phosphine is rapidly injected into the reaction flask, and the reaction is allowed to continue for 20 minutes. The reaction solution is rapidly cooled to room temperature. Acetone is added to facilitate formation of a precipitate, the precipitate is separated with a centrifuge, and the isolated precipitate is dispersed in toluene again to prepare a toluene dispersion. The prepared InZnP semiconductor nanocrystals have an average size of about 2.5 nm.

Selenium is dispersed in trioctyl phosphine (TOP) to prepare a Se/TOP stock solution, and sulfur is dispersed in trioctyl phosphine to prepare a S/TOP stock solution.

Zinc acetate and oleic acid are dissolved in trioctylamine in a 200 mL reaction flask, and the reaction mixture is vacuum-treated at 120° C. for 10 minutes. The reaction flask is filled with nitrogen (N$_2$), the solution is heated to 320° C., and the toluene dispersion of the prepared semiconductor nanocrystal is added to the reaction flask, and the Se/TOP stock solution, the S/TOP stock solution, and optionally zinc oleate are injected into the reaction flask and a reaction is carried out to provide a crude solution including a semiconductor nanoparticle wherein a semiconductor nanocrystal shell including zinc, selenium, and sulfur is formed on the InZnP semiconductor nanocrystal.

An excess amount of ethanol is added to precipitate out the semiconductor nanoparticles, which are then separated with a centrifuge. After the centrifugation, the supernatant is discarded and the precipitate is dried and then dispersed again in toluene or chloroform to form a redispersion solution. For the prepared semiconductor nanoparticles, a photoluminescent analysis is carried out, and the results confirms that the prepared semiconductor nanoparticles emit green light.

Example 1

Polyethylene-polyacrylic acid copolymer (or poly(ethylene-co-acrylic acid)) (Cas No:_9010-77-9, Sigma Aldrich, bead type, hereinafter, Nucrel or polymer) is mixed with the crude solution (or the redispersion solution), a solution prepared by dissolving aluminum chloride in trioctylphosphine is added dropwise thereto to prepare a mixture, which undergoes a reaction at 120° C. for 30 minutes to form a composite. An amount of the aluminum chloride is about 0.027 grams based on 1 gram of the polymer. In the composite, an amount of the semiconductor nanoparticle is about 1 weight percent (wt %) to about 10 wt %.

Example 2

A composite is prepared in the same manner as in Example 1 except for using diethyl zinc instead of the aluminum chloride.

Comparative Example 1

A composite is prepared in the same manner as in Example 1 except for not using aluminum chloride.

Comparative Example 2

The redispersion of the semiconductor nanoparticles is prepared as a composition.

Comparative Example 3

A composite is prepared in the same manner as in Example 1 except for using diethyl zinc instead of the aluminum chloride.

The redispersion of semiconductor nanoparticles is mixed with pentaerythritol tetrakis(3-mercaptopropionate) and 1,3,5-triallyl-1,3,5 triazine-2,4,6(1H,3H,5H)trion and the solvent is removed therefrom and an Irgacure initiator (e.g., Irgacure 184 (CAS 947-19-3) Irgacure 754, or Irgacure TPO, CAS 75980-60-8) is added to prepare a resulting mixture. The resulting mixture is irradiated with UV light at room temperature for a predetermined time (e.g., 10 seconds to 10 minutes) to prepare a composite.

Experimental Example 1

A flow temperature is measured for each of the composites prepared Example 1, Example 2, and Comparative Example 1 by placing the composite in a glass flask, closing a lid of the glass flask, turning the flask upside down, and raising a temperature thereof.

The results are shown in Table 1.

TABLE 1

| | Flow temperature |
|---|---|
| Example 1 | about 120° C. |
| Example 2 | about 90° C. |
| Comparative Example 1 | about 60° C. |

The results of Table 1 confirm that the composites of Example 1 and Example 2 exhibit a higher flow temperature than the composite of Comparative Example 1. The results indicate that for the composites of Example 1 and Example 2, the addition of the multivalent metal substance substantially increases the crosslinking property between the components in comparison with the composite of Comparative Example 1.

Experimental Example 2

Figure 9:
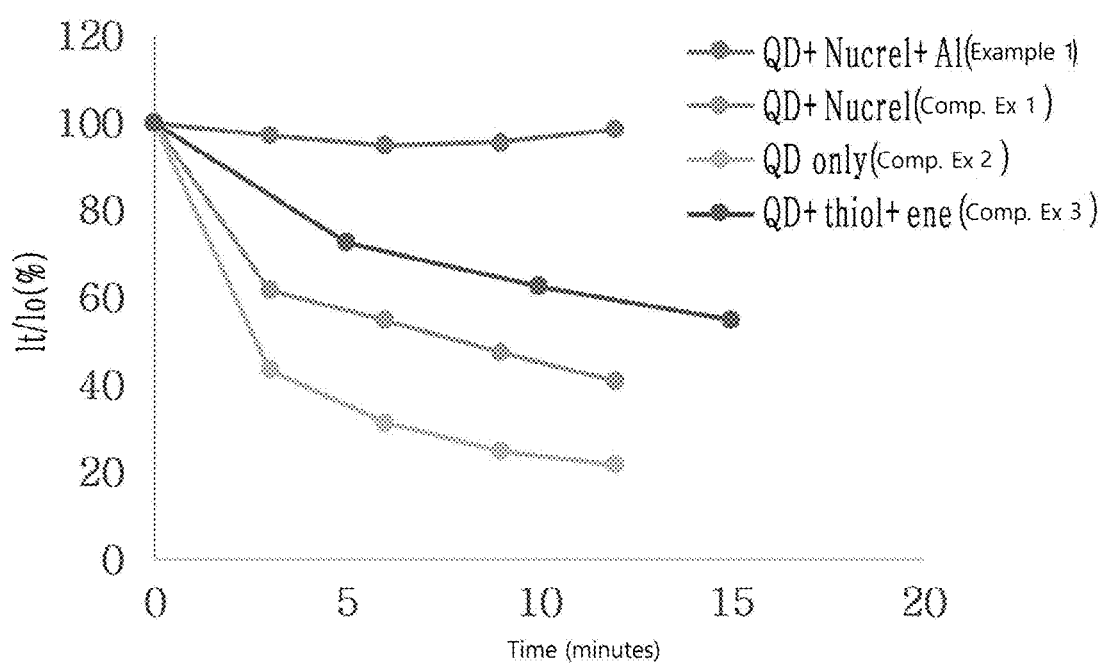
FIG. 9 is a graph of percent of photoluminescent (PL) intensity ($I_t$) relative to initial PL intensity ($I_0$) versus time (minutes) showing the results of Experimental Example 2.

Using each of the composite of Example 1, the composites of Comparative Examples 1 and 3, and the composition of Comparative Example 2, a test sample having an area of $8.06*10^{-8}$ square centimeters ($cm^2$) is prepared, and for the prepared test samples, a stability test is conducted and the results are shown in FIG. 9.

A laser having an excitation wavelength of about 420 nanometers (nm) (manufactured by PicoQuant GmbH, MicroTime100) is used to irradiate the test sample at a power of about 5 microwatts ($\mu W$) (i.e., 1,700,000 candelas per square meter (nit) or 16,100,000 nit with a conversion of a wavelength of about 450 nm) for 12 minutes and for each sample, an initial photoluminescent (PL) intensity ($I_0$) and a PL (photoluminescent) intensity ($I_t$) at a predetermined time (3 minutes, 6 minutes, 9 minutes, 12 minutes, or 15 minutes) are measured and a ratio, relative percentage, of the ($I_t$) to the ($I_0$) are measured. The PL analysis is conducted by using Kymera193i spectrograph system (from Andor technology Ltd).

The results of FIG. 9 confirm that for Example 1, no substantial damage by the laser beam is made, e.g., there is no substantial decrease in in $I_t/I_0$, while the composites of Comparative Examples 1 and 3 and the composition of Comparative Example 2 show a substantial decrease in $I_t/I_0$.

While the invention has been particularly shown and described with reference to embodiments thereof, it will be understood by those of ordinary skill in the art that various changes in form and details may be made therein without departing from the spirit or scope of the invention as defined by the following claims.

DESCRIPTION OF SYMBOLS

100: light emitting panel
110: lower substrate
111: buffer layer
124: gate electrode
140: gate insulation film
154: semiconductor layer
160: protective layer
173: source electrode
175: drain electrode
200: color conversion panel
210: upper substrate
220: light blocking pattern
230: color filter layer
250: partition wall
270a: first color conversion region
270: color conversion layer
270b: second color conversion region
270c: third (color conversion or light transmitting) region
290: encapsulation layer
300: light transmitting layer
1000: display panel

What is claimed is:

1. A display panel, comprising
a light emitting panel comprising a plurality of light emitting units; and
a color conversion panel comprising a surface opposite a surface of the light emitting panel,
wherein the plurality of light emitting units comprises a first light emitting unit and a second light emitting unit,
wherein the color conversion panel comprises a color conversion layer comprising a first color conversion region and a second color conversion region, and a partition wall defining the first color conversion region and the second color conversion region,
wherein the first light emitting unit and the second light emitting unit are configured to provide the first color conversion region and the second color conversion region, respectively, with an incident light of an intensity of greater than or equal to about 10,000 candelas per square meter and less than or equal to about 17,000,000 candelas per square meter,
wherein the first color conversion region comprises a first semiconductor nanoparticle-polymer composite comprising a first polymer matrix and first semiconductor nanoparticles dispersed in the first polymer matrix, and the first semiconductor nanoparticle-polymer composite is configured to convert the incident light to a first light,
wherein the second color conversion region comprises a second semiconductor nanoparticle-polymer composite comprising a second polymer matrix and second semiconductor nanoparticles dispersed in the second polymer matrix, the second semiconductor nanoparticle-polymer composite is configured to convert the incident light to a second light, and the second light has a maximum luminescent peak wavelength different from the first light,
wherein the first color conversion region and the second color conversion region each independently have a light incident area of greater than or equal to about 1 square micrometer and less than or equal to about 1,000 square micrometers,
wherein the first polymer matrix comprises a polymer comprising a unit having a carboxyl group or an anion form of a carboxyl group,
wherein the first semiconductor nanoparticle-polymer composite further comprises an additional metal substance distributed in the first polymer matrix, and
wherein the additional metal substance comprises a Group IIB metal, a Group IIIA metal, or a combination thereof.

2. The display panel of claim 1, wherein a luminescent peak wavelength of the incident light is greater than or equal to about 420 nanometers and less than about 490 nanometers.

3. The display panel of claim 1, wherein the first light emitting unit and the second light emitting unit are spaced apart from one another, and optionally wherein a partition wall is disposed between the first light emitting unit and the second light emitting unit.

4. The display panel of claim 1, wherein the light emitting unit comprises a microsized light emitting diode, an inorganic nanosized light emitting diode, or a combination thereof.

5. The display panel of claim 1, wherein a width of the first color conversion region and a width of the second color conversion region are each independently greater than or equal to about 1 micrometers and less than or equal to about 600 micrometers.

6. The display panel of claim 1, wherein a luminescent peak wavelength of the first light is in a range of greater than or equal to about 500 nanometers and less than or equal to about 580 nanometers, and a luminescent peak wavelength of the second light is in a range of greater than about 580 nanometers and less than or equal to about 680 nanometers, or
wherein a luminescent peak wavelength of the second light is in a range of greater than or equal to about 500 nanometers and less than or equal to about 580 nanometers, and a luminescent peak wavelength of the first light is in a range of greater than about 580 nanometers and less than or equal to about 680 nanometers.

7. The display panel of claim 1, wherein the first semiconductor nanoparticles, the second semiconductor nanoparticles, or a combination thereof comprise a Group II-VI compound, a Group III-V compound, a Group IV-VI compound, a Group IV element or compound, a Group I-III-VI compound, a Group I-II-IV-VI compound, or a combination thereof.

8. The display panel of claim 1, wherein an amount of the first semiconductor nanoparticles in the first semiconductor nanoparticle-polymer composite is greater than or equal to about 10 weight percent and less than or equal to about 50 weight percent, based on a total weight of the first semiconductor nanoparticle-polymer composite.

9. The display panel of claim 1,
wherein the first semiconductor nanoparticle-polymer composite further comprises metal oxide particles dispersed in the first polymer matrix, or
wherein the second semiconductor nanoparticle-polymer composite further comprises metal oxide particles dispersed in the second polymer matrix, or
both the first semiconductor nanoparticle-polymer composite and the second semiconductor nanoparticle-polymer composites further comprise metal oxide particles dispersed in the first polymer matrix and in the second polymer matrix.

10. The display panel of claim 9, wherein in the composite, an amount of the metal oxide particles is greater than or equal to about 0.1 weight percent and less than or equal to about 20 weight percent, based on a total weight of the composite.

11. The display panel of claim 1, wherein the additional metal substance comprises aluminum, gallium, indium, zinc, or a combination thereof.

12. The display panel of claim 1, wherein the additional metal substance comprises a hydrocarbyl aluminum, an aluminum halide, a zinc halide, a hydrocarbyl zinc, or a combination thereof.

13. The display panel of claim 1, wherein the first polymer matrix, the second polymer matrix, or a combination thereof comprises a polyalkylene-poly(meth)acrylic copolymer, and optionally wherein the first polymer matrix, the second polymer matrix, or a combination thereof further comprises a crosslinked polymer.

14. The display panel of claim 1, wherein the additional metal substance comprises aluminum, the first semiconductor nanoparticles comprise indium and phosphorus, and in the first semiconductor nanoparticle-polymer composite, a mole ratio of aluminum to indium is greater than or equal to about 1:1 and less than or equal to about 50:1.

15. The display panel of claim 1, wherein the additional metal substance comprises zinc, the first semiconductor nanoparticles comprise a zinc chalcogenide, and in the first semiconductor nanoparticle-polymer composite, a mole ratio of zinc to a sum of a chalcogen element is greater than or equal to about 1.3:1 and less than or equal to about 5:1.

16. The display panel of claim 1, wherein the first semiconductor nanoparticle-polymer composite exhibits a relative luminance intensity of greater than or equal to about 60%, after being irradiated with an incident light having a luminous intensity of 9,000,000 candelas per square meter for fifteen minutes, calculated according to the formula:

$$\text{relative luminance intensity} = (I_{15}/I_0) \times 100\%$$

wherein
$I_{15}$ is a photoluminescence intensity of the composite at 15 minutes, and
$I_0$ is an initial photoluminescence intensity of the composite.

17. A method of producing the display panel of claim 1, which comprises:
providing the color conversion panel on the light emitting panel, and
wherein the color conversion panel is prepared by
depositing a first ink composition and a second ink composition in a first color conversion region and a second color conversion region, respectively, on a substrate with or without a partition wall formed on the substrate to define the first color conversion region and the second color conversion region, to form the first semiconductor nanoparticle-polymer composite and the second semiconductor nanoparticle polymer composite, to prepare a color conversion panel; and
providing the color conversion panel on a light emitting panel to produce the display panel,
wherein the first ink composition comprises the first semiconductor nanoparticles, the polymer comprising a repeating unit comprising a carboxyl group or an anion of a carboxyl group, and the additional metal substance;
optionally wherein the first ink composition further comprises a polymerizable monomer capable of providing a cross-linked polymer, a binder compound having a carboxylic acid group and being soluble in an alkaline solution, a polymerization initiator, an organic solvent, a metal oxide particle, or a combination thereof.

18. The method of claim 17, wherein the additional metal substance comprises an alkylated aluminum, an aluminum halide, a zinc halide, an alkylated zinc, or a combination thereof.

19. The method of claim 17, wherein in the first ink composition, an amount of the first semiconductor nanoparticles is greater than or equal to about 10 weight percent and less than or equal to about 50 weight percent, based on a total solid content of the first ink composition, and
wherein an amount of the additional metal substance in the first ink composition is greater than or equal to about 0.01 wt % and less than or equal to about 20 wt %, based on a total weight of the first semiconductor nanoparticles, and wherein the first ink composition exhibits a flowing temperature of greater than or equal to about 85° C.

20. An electronic device comprising the display panel of claim 1.

* * * * *